US008803288B1

(12) United States Patent  
Marino et al.

(10) Patent No.: US 8,803,288 B1  
(45) Date of Patent: Aug. 12, 2014

(54) ANALOG TRANSCAP DEVICE

(71) Applicants: Fabio Alessio Marino, Conselve (IT); Paolo Menegoli, San Jose, CA (US)

(72) Inventors: Fabio Alessio Marino, Conselve (IT); Paolo Menegoli, San Jose, CA (US)

(73) Assignee: Eta Semiconductor Inc., San Jose, CA (US)

( * ) Notice: Subject to any disclaimer, the term of this patent is extended or adjusted under 35 U.S.C. 154(b) by 0 days.

(21) Appl. No.: 13/888,368

(22) Filed: May 7, 2013

Related U.S. Application Data

(63) Continuation-in-part of application No. 13/068,161, filed on May 5, 2011, now Pat. No. 8,498,094.

(60) Provisional application No. 61/644,070, filed on May 8, 2012, provisional application No. 61/709,907, filed on Oct. 4, 2012, provisional application No. 61/772,461, filed on Mar. 4, 2013.

(51) Int. Cl.  
*H01L 27/12* (2006.01)  
*H01L 29/93* (2006.01)

(52) U.S. Cl.  
CPC ................................ *H01L 29/93* (2013.01)  
USPC ........................................................ 257/602

(58) Field of Classification Search  
USPC ................. 257/602, 300; 361/277, 278, 290; 261/279  
See application file for complete search history.

(56) References Cited

U.S. PATENT DOCUMENTS

| | | | |
|---|---|---|---|
| 3,829,743 A | 8/1974 | Kohashi | |
| 7,375,948 B2 * | 5/2008 | Higgins | 361/306.2 |
| 7,403,140 B2 | 7/2008 | Miyagi et al. | |
| 7,622,760 B2 | 11/2009 | Ogawa et al. | |
| 2005/0093000 A1 * | 5/2005 | Tanimoto et al. | 257/77 |
| 2012/0139020 A1 * | 6/2012 | Chen et al. | 257/296 |

* cited by examiner

Primary Examiner — Thao P Le

(57) ABSTRACT

A novel semiconductor variable capacitor is presented. The semiconductor structure is simple and is based on a semiconductor variable MOS capacitor structure suitable for integrated circuits, which has at least three terminals, one of which is used to modulate the equivalent capacitor area of the MOS structure by increasing or decreasing its DC voltage with respect to another terminal of the device, in order to change the capacitance over a wide ranges of values. Furthermore, the present invention decouples the AC signal and the DC control voltage avoiding distortion and increasing the performance of the device, such as its control characteristic. The present invention is simple and only slightly dependent on the variations due to the fabrication process. It exhibits a high value of capacitance density and, if opportunely implemented, shows a quasi linear dependence of the capacitance value with respect to the voltage of its control terminal.

20 Claims, 22 Drawing Sheets

ANALOG TRANSCAP DEVICE

RELATED APPLICATION DATA

The present application is a continuation in part of the regular patent application U.S. Ser. No. 13/068,161 entitled "Semiconductor Variable Capacitor", filed on May 5, 2011. Furthermore, the present patent application claims priority also from the following U.S. Provisional Patent Application 61/644,070 for "Semiconductor controllable capacitor" filed on May 8, 2012, U.S. 61/709,907 for "Transcap Semiconductor variable capacitor" filed on Oct. 4, 2012, U.S. 61/772,461 for "Variable Capacitor Circuit Applications" filed on Mar. 4, 2013.

BACKGROUND OF THE INVENTION

1. Field of the Invention

The present invention is in the field of semiconductor structures. The present invention is further in the field of semiconductor structures of variable capacitance devices. Particularly, it relates to a MOS type variable capacitance device for semiconductor circuits. The implementation is not limited to a specific technology, and applies to either the invention as an individual component or to inclusion of the present invention within larger systems which may be combined into larger integrated circuits.

2. Brief Description of Related Art

Semiconductor capacitors are one of the fundamental components for integrated circuits. A variable capacitor is a capacitor whose capacitance may be intentionally and repeatedly changed under the influence of DC bias voltages. Variable capacitors are often used in L-C circuits to set the resonance frequency, e.g. to tune a radio (therefore they are sometimes called tuning capacitors), or as a variable reactance, e.g. for impedance matching in antenna tuners.

A voltage-controlled capacitor is well known in the art as "varactor", in which the thickness of a depletion region formed in a pn-junction diode is varied by changing a reverse bias voltage to alter the junction transition capacitance. Any junction diode exhibits this effect (including pn-junctions in transistors), but devices used as variable capacitance diodes are designed with a large junction area and a doping profile specifically chosen to maximize capacitance.

Their use is limited to low signal amplitudes to avoid obvious distortions as the capacitance would be affected by the change of signal voltage, precluding their use in the input stages of high-quality RF communications receivers, where they would add unacceptable levels of inter-modulation. At VHF/UHF frequencies, e.g. in FM Radio or TV tuners, dynamic range is limited by noise rather than large signal handling requirements, and varcaps are commonly used in the signal path. Furthermore an extremely high value of capacitance cannot be obtained even with a reverse bias because the reverse-biased saturation current is not exactly equal to zero.

Varcaps are used for frequency modulation of oscillators, and as reported in Miyagi et al. (U.S. Pat. No. 7,403,140) to make high-frequency voltage controlled oscillators (VCOs), the core component in phase-locked loop (PLL) frequency synthesizers that are ubiquitous in modern communications equipment. It is intended for antenna impedance matching in multi-band GSM/WCDMA cellular handsets and mobile TV receivers that must operate over wide frequency ranges such as the European DVB-H and Japanese ISDB-T mobile TV systems.

Several prior art attempts to improve varactors performance, so as to effectively obtain high capacitance density and a linear dependence of the capacitance value over a wide range of control voltages, have been documented. In particular, an interesting solution is reported in Ogawa et al. (U.S. Pat. No. 7,622,760) where the synthesis of two MOS capacitor is used to obtain a good linearity over a wide range relative to the DC control voltage. However, the prior art described above discloses a varactor that is still a two terminal device, and its capacitance is varied imposing a DC voltage between its two terminals. This leads to the disadvantage that the AC voltage is superimposed upon the DC control value, and therefore the capacitance value is distorted by the AC voltage.

There is therefore a need of a novel variable capacitor with at least three terminals, where at least one control terminal separated from the capacitance terminals is added. The novel structure should allow the control of the capacitance without overlapping the DC control voltage with the AC signal avoiding the distortion of the capacitance value during the circuit operation. This device, differently from the prior art described above, should use the voltage of the control terminal to modulate the area of one of the capacitor plates of a MOS capacitance rather than the distance between the two equivalent electrodes of a pn-junction capacitor.

A similar approach, where a three terminal MOS varactor is used, is disclosed in Kohashi (U.S. Pat. No. 3,829,743). In this patent the author describes a variable capacitance device having a thin film of dielectric material and in which the area of an equivalent plate electrode is varied by changing the voltage of the control terminal or under the influence of radiations.

Referring to the drawings in Kohashi and more particularly to FIG. 1 and FIG. 2 of the document, the variable capacitance device comprises a pn-junction diode placed directly above the dielectric film and a source of DC voltage. A lead wire made of gold or aluminum is placed in ohmic contact with an end surface of each of the p and n regions. One lead is connected to the movable contact of a double-throw switch. The double-throw switch has two fixed contacts connected to two batteries, which in turn are connected together to the other lead placed in electrical contact with the n region.

As shown, a thin film of high-insulation, low-dielectric-loss dielectric material is deposited on the side surface of the diode perpendicular to the junction. The described device uses the voltage between the n and the p regions of the pn-junction to modulate the depletion region above the oxide in order to change the overlap surface between the p and n regions with the metal plate under the oxide layer. FIG. 3 of the cited patent shows the structure resulting by the parallel of two structures as presented in FIG. 1.

The described structures can be used only for discrete components. As underlined by the author himself in the patent, they are not suitable for integrated circuits. The integrated version of the structure shown in FIG. 1 is reported in FIG. 4. In this case, as in the previous one, both the depletion regions in the p and n regions are used to modulate the capacitance, which lead to a difficult control of the device performance and capacitance-voltage relation (the process variations of the p-region sum up with the one of the N region and to the variability on the position of the pn-junction).

Furthermore, in all these structures, the DC voltage is applied between one terminal of the capacitance and a region directly in contact with the capacitance dielectric layer overlapping the metal terminal 27 in FIG. 1 (or 45 in FIG. 3), causing a distortion of the capacitance value due to the modulation of the MOS capacitance. Varying the DC voltage between the p and n regions, also the DC voltage drop between one of these two regions and the metal terminal changes, and that causes an enhancement or depletion of the semiconductor surface affecting the capacitance value.

The last structure of interest disclosed in Kohashi is the one illustrated in FIG. 14 of the document. In this case the variable capacitance is the resulting synthesis of the series of the capacitances of the pn-junctions and a MOS structure. The capacitance terminals 190 and 193 are coupled through a p+/n junction and the MOS capacitance. In this case the resulting capacitance and its range of variation are therefore very low. Furthermore, in this configuration the capacitance depends also on the thickness of the depletion regions of the two p+/n junction as in conventional diode based varactors, leading to a high distortion of the capacitance value. Finally, it is important to notice that none of the structures described in Kohashi have a linear relation between the control voltage and the capacitance value.

The present invention is simple and much less sensitive to process variation with respect the structures described above. It is suitable for integrated circuits and presents a high capacitance density value and high linearity. If appropriately designed, the present invention exhibits a quasi-linear dependence of the capacitance over a wide range of control voltage values. All these characteristics are extremely important for the practical implementation of the present invention and clearly distinguish the present invention from the varactors devices used nowadays in the integrated-electronic industry.

It is a purpose of the present invention to describe a novel structure of a semiconductor variable capacitor suitable for integrated circuits with at least three terminals, simple and slightly sensible to process variations, which offers the advantage of much higher capacitance per unit area, wider control ranges, high Q and low distortion of the RF signal applied to the capacitor.

SUMMARY OF THE INVENTION

The present invention describes a MOS based semiconductor variable capacitor structure, named transcap, suitable for integrated circuits, which has at least three terminals, one of which is used to modulate the equivalent capacitor area of the MOS structure by increasing or decreasing its DC voltage with respect to another terminal of the device, in order to change the capacitance over a wide range of values. Furthermore, the present invention decouples the AC signal and the DC control voltage avoiding distortions and increasing the performance of the device, such as control reliability. The present invention is simple and only slightly dependent on the variations related to the fabrication process.

The main concept of the present invention stems from a three terminals semiconductor variable capacitor as described in the regular patent application U.S. Ser. No. 13/068,161 entitled "Semiconductor Variable Capacitor", filed by the same applicants on May 5, 2011. Furthermore, the present patent application claims priority from the following U.S. Provisional Patent Applications, also filed by the same applicants: U.S. 61/644,070 for "Semiconductor controllable capacitor" filed on May 8, 2012, U.S. 61/709,907 for "Transcap Semiconductor variable capacitor" filed on Oct. 4, 2012, U.S. 61/772,461 for "Variable Capacitor Circuit Applications" filed on Mar. 4, 2013.

The most important parameters of a variable capacitor are: i) the linearity of the device, ii) the tuning range, defined as the ratio between the maximum and the minimum capacitance between the main two terminal of the device (C1 and C2), and iii) the quality factor defined as $$Q = 1/(2\pi f \cdot ESR \cdot C)$$

where ESR and C are, respectively, the equivalent series resistance and the capacitance seen between C1 and C2, and f is the frequency of the RF signal applied to the device.

An analog transcap device is a three-terminal semiconductor variable capacitor, where the capacitance between the two main terminals of the device (C1 and C2) can be varied by changing the DC voltage applied between the control terminal CTRL and one of the other two main terminals (C2). This characteristic allows for the decoupling of the AC signal from the DC control voltage preventing distortions and increasing the performance of the device, such as control reliability. A transcap device can be implemented with several semiconductor structures, each one of them has advantages and disadvantages as discussed in the following.

The simplest structure of an analog transcap device is illustrated in FIG. 1, where the basic operation principle of the device is shown as well. In this case the C2 terminal 9 is connected to ground (not shown in figure) and a DC voltage is applied between the Control terminal CTRL 4 and the C2 terminal 9 in order to modulate the capacitance between C1 and C2.

As it can be seen in FIG. 1, the structure of a transcap device is very simple and is obtained from the one of a MOS capacitor by adding the following modifications: i) a n+ implantation 8 and a p+ implantation 5 are formed on the two sides of the MOS structure in order to create a pn junction to modulate the surface area of the semiconductor capacitance plate underneath the oxide 3, ii) the capacitor oxide 3 is preferably thicker than what is usually employed in MOS capacitors in order to minimize the modulation of the carrier population at the semiconductor-oxide interface by the RF signal applied between C1 and C2, iii) it is preferable to have the highly doped implantations not auto-aligned with the MOS structure (especially the n+ region 8) in order to minimize the parasitic capacitance associated with the control region 5 and to improve the isolation of the n+ region 8 for high control voltages, iv) the work function of the region 2 above the oxide 3 is chosen to maximize the device performance (e.g. by utilizing a n-doped poly-silicon material instead of a p-doped one, even if the device is built in a n-well region, or by utilizing a metallic material with an opportune work-function), v) The substrate 7 is properly chosen in order to maximize the device performance (e.g. this can be an insulator, semi-insulator or an intrinsic/near-intrinsic semi-conductor in order to decrease the parasitic capacitances associated with the substrate or it can be made using n-doped or p-doped semiconductor with an appropriate doping profile in order to maximize the control on the depletion region 6 and/or the device quality factor).

In order to better understand the working principle of this device, let's assume that the control terminal 4 is biased with a negative voltage with respect to the C2 terminal 9, the depletion region 6 of the pn-junction widens under the dielectric layer 3 reducing the area of the equivalent electrode formed by the n-well, and with it the effective capacitance area and value. Vice-versa, by increasing the control voltage from −20V to zero, as an example, the depletion region 6 of the pn-junction is reduced, leading to an increase of the capacitance.

Differently from conventional MOS capacitors and prior art varactors described above, where the capacitance between the two main terminals is defined only by the DC bias applied across the capacitance, in the present invention the capacitance value is determined by the bias of the third terminal 4 which modulates the depletion region 6 under the dielectric layer 3 increasing or decreasing the equivalent surface of the capacitance between the n region 10 and the C1 terminal 1.

The capacitance value depends only on the depletion region of the n region 10, which is uniform and well controllable. This characteristic dramatically reduces the device dependence on the process variations. Furthermore, the variation of the DC voltage of the control terminal 4 does not alter the DC voltage between the two terminals 1 and 9 of the capacitance, allowing for a very good control on the device characteristic.

The illustrated structure requires the use of a negative control voltage due to the chosen doping profiles. The dual version can also be obtained (by reversing all the doping types) in order to use a positive control voltage. However, the dual configuration has a lower quality factor with respect to the illustrated version due to the lower mobility of a p-doped layer with respect to n-doped semiconductors.

In order to reduce the control voltage required to achieve the maximum tuning range of the device, a second control region 20 can be added to the structure as shown in FIG. 2. The presence of the second control region 20 allows for the reduction of the voltage required to deplete the semiconductor area under the oxide 12. However, the quality factor of the structure is reduced as well due to the geometry of the device. In order to avoid this collateral effect, the C2 implantation 19 can be placed in the third dimension, i.e. in the direction perpendicular to the cross section shown in FIG. 2.

A buried implantation can also be added as shown in FIG. 3, in order to minimize the parasitic resistance associated with the C2 terminal 31. Also in this case, if desired, the C2 sink implantation can be placed in the third dimension, i.e. in the direction perpendicular to the cross section shown in FIG. 3.

The control of the depletion region under the C1 oxide can be increased also by adding a p+ buried implantation as shown in FIG. 4. This configuration is preferable with respect to the previous one, since the quality factor can be maximized maintaining a high control on the depletion region under the oxide. In order to better understand the behavior of a transcap device, an example of CV characteristic obtained from the numerical simulation of a transcap device (according to the embodiment of FIG. 4) has been reported in FIG. 5, where the capacitance 43 between the C1 and C2 terminals is shown as a function of the control voltage. For the sake of completeness, the quality factor 44 of the device (for a 2 GHz RF signal) has been reported as a function of the control voltage as well in the same figure.

In order to minimize the parasitic capacitance associated with the control region and to allow for an improved isolation of the n+ region for high control voltages, Shallow Trench Isolations (STI) can be created at the edges of the C1 terminal as shown in FIG. 6. In general, a STI region can also be created only on the CTRL terminal side or only at the C2 terminal side, depending on the process characteristics and performance requested by the application.

Another interesting implementation of a transcap device is shown in FIG. 7, where a p-doped (or intrinsic, or near-intrinsic) region 56 has been added between the p+ region 58 and the n region 62 in order to improve the breakdown of the pn junction and at the same time to reduce the parasitic capacitance between C1 and the CTRL terminal. Another possible implementation is to replace completely the n-region 62 under the oxide 55 with a p doped region.

The embodiments illustrated above are based on a MOS structure. This makes the capacitance value dependent on the voltage $V_{C1C2}$ between the terminal C1 and C2. In order to decrease the capacitance dependence on the voltage $V_{C1C2}$, the control region 2 of FIG. 1 can be made in semiconductor of the same (or opposite) doping type and similar impurities concentration of the substrate as illustrated in FIG. 8.

The symmetry created in this configuration between the two terminals of the capacitance partially compensates the carrier modulation by the RF signal applied to the main terminals of the device, reducing the capacitance dependence from the $V_{C1C2}$ voltage.

Another embodiment of the present invention is illustrated in FIG. 9. In this case, an extra oxide layer 72 has been added on the top of the structure in order to decrease the distortion of the device with respect to the RF signal applied between C1 and C2. A similar approach has been used in the embodiment of FIG. 10, where regions 79 and 80 of FIG. 9 have been replaced with a single highly conductive layer 90.

In order to significantly limit the dependence of the MOS capacitor from the $V_{C1C2}$ voltage and, at the same time, increase the specific capacitance, the embodiment of FIG. 11 can be utilized. As it can be seen this embodiment is similar to the one shown in FIG. 1, with the exception that a multiplicity of small semiconductor pillars 101 has been formed on the top of the semiconductor layer 94. Above these semiconductor pillars, the capacitance dielectric 100 has been grown (or deposited) and the C1 region 92 has been formed. The upper portion 93 of these semiconductor pillars 101 has been heavily doped in order to maximize the specific capacitance and make the MOS system independent from the $V_{C1C2}$ voltage.

The operation principle of this embodiment is similar to the one of the structure illustrated in FIG. 1, with the difference that the capacitance is quantized: by increasing the voltage of the control terminal 95 toward negative values with respect to the C2 terminal, one or more of the semiconductor pillars are isolated from the C2 terminal 99, thus decreasing the capacitance of the device. If the device is not optimized, the capacitance characteristic, as a function of the control voltage, assumes therefore a stairs like shape. The more the control voltage increases toward negative values, the more pillars are isolated thus creating a sequence of step transactions on the capacitance value.

By optimizing the height, width and doping profile of the different pillars, the dependence of the device capacitance as a function of the control voltage can be made more linear. For example by lowering the height of the pillars, the step transitions are smoothed out to the point that a linear control range can be identified.

The upper portion 93 of the semiconductor pillars 101 in FIG. 11, can be limited to the upper part of the pillars or can be extended down to the bottom of them. In general, the highly conductive portion 93 of the semiconductor pillars, or even the entire pillars, can also be realized using metallic materials. It is important to notice that the semiconductor (or metallic) pillars, which can be formed with semiconductor trench process steps, or multi-layer deposition techniques, can have different shapes one from each other.

In order to reduce the quantized nature of the structure illustrated in FIG. 11, an extra dielectric layer 105 can be inserted between the pillars and the semiconductor layer 106 as shown in FIG. 12. In this case the extra dielectric 105 improves the characteristic of the device, smoothing out the capacitance variation as a function of the control voltage. The analog behavior of this embodiment is shown in FIG. 13 where the capacitance 115 between the two main terminals C1 and C2 of the structure and the quality factor 114 (for a 2 GHz RF signal) have been reported as a function of the control voltage.

As shown in FIG. 14, the upper dielectric layer 104 of FIG. 12 can also be omitted and the pillars can be directly connected to the C1 terminal in order to increase the capacitance density and simplify the manufacturing process. Also in this case, a portion or the entire pillars can be highly doped to minimize the dependence of the capacitance value from the voltage applied between the two main terminals C1 and C2. Furthermore, also in this case, the pillars can be made both in semiconductor or metallic material as shown in FIG. 15.

In the embodiment of FIG. 15, where the highly doped regions (or metal regions) inside the pillars extend down to the oxide layer 130, the pillar structures can be formed as an array of MOSFET gates, one near the other, by utilizing each polysilicon (o metal) gate region as a pillar. Alternatively, the pillar structures can be formed with a deposition (or growth) process step followed by a etch, or with multi-layer deposition process steps followed by polishing of the upper surface in order to level the final structure before the formation of the highly conductive region 128.

Different doping profiles can be utilized in order to improve the device performance. For example, in FIG. 16 a heavily doped buried region 144 has been added in order to increase the control on the device characteristic. A similar implantation of opposite doping-type can also be used to decrease the parasitic resistance associated with the C2 terminal.

A double control configuration can be obtained also in this case by adding a second p+ region 158 as illustrated in FIG. 17. Also in this case, a buried implant 155 can be added in order to decrease the parasitic resistance associated with the C2 terminal 157.

If the manufacturing process utilized does not allow for low defect dielectric/semiconductor interfaces, as it can be the case in III-V technologies, the performance of the transcap device could be affected. In order to overcome this limitation, the insulating layer of the variable capacitor can be replaced with a (doped or intrinsic) wide energy-gap semiconductor layer. In this case, the C1 terminal can be formed directly in contact with the wide energy-gap semiconductor layer so as to form a Schottky contact.

Alternatively, a (doped or intrinsic) low energy-gap semiconductor layer 164 can be interposed between the wide energy-gap semiconductor layer 169 and the C1 contact region 163 as shown in FIG. 18, in order to minimize the conduction between the C1 terminal and the other device terminals. Another possibility is to use a dielectric material to form region 164 in order to further improve the isolation of the C1 terminal, without affecting the device performance.

As shown in FIG. 19, the present invention can be realized using also a vertical configuration. The vertical geometry of the device drastically increases the capacitance per unit area without requiring silicon on insulator process technology, which significantly lowers the cost of the device. This configuration can be a valid alternative especially in the case where p+ implantations are not available in the manufacturing process.

In this structure a p+ doped layer 174 replaces the p+ implantation and the depletion region moves vertically instead of horizontally with respect to the main substrate plain. It is important to notice that the n+ region 177 and the p+ region 174 can be reversed, by forming the n+ region on the bottom of the device and the p+ region on the top.

FIG. 20 illustrates another vertical embodiment of the present invention. As it can be seen, in this structure the contact with respect to the C2 terminal has been placed in the third dimension, i.e. in the direction perpendicular to the cross section. Furthermore, a fourth terminal 186 has been added to the device so as to allow for the direct connection of the present structure in a floating configuration. A planar implementation of this embodiment is shown in FIG. 21, where two RF regions are present between the p+ region 193 and the n+ region 195.

The formation of the control or C2 region in the third dimension is a concept that can be used for any of the previously described structures in order to increase the control on the device characteristic without degrading the quality factor. An example of embodiment of the present invention where the C2 implantation 205 has been placed in the third dimension is shown in FIG. 22. In this case, two insulating regions 204 and 206 (formed for example by Shallow Trench Isolations) can also be added on the sides of the n+ implantation 205 as shown in figure, in order to improve the device performance.

A third control region 210 can also be added behind the C1 terminal 209 as shown in FIG. 23 in order to further improve the control on the device capacitance and the overall CV characteristic of the device.

Another variant is shown in FIG. 24, where an extra n+ region 219 has been added behind the C1 terminal 218 (instead of the third p+ region 210 of FIG. 23) in order to increase the quality factor of the device.

An example of CV characteristic 230 obtained from the simulation of the structure of FIG. 22, is illustrated in FIG. 25. Again also the quality factor 229 of the device for a 2 GHz RF signal is reported in the same plot.

Similar configurations can be utilized also in the case where an n+ buried or a p+ buried implant is available as shown in FIG. 26 and FIG. 27, respectively. In general many doping profiles can be utilized in order to improve the device performance depending on the available process technology. A graded doped region under the C1 oxide can also be exploited in order to shape the CV characteristic of the device.

In FIG. 28 a transcap device is shown where the pn-junction between the CTRL terminal 249 and the C2 terminal 255 has been formed with a super-junction profile, i.e. a series of p and n stripes alternated one to each other, in order to increase the breakdown voltage of the junction itself. In FIG. 29 a slightly different implementation is reported, where the super-junction has been formed only on one side of the structure, living a uniformly n-doped region 266 underneath the oxide 257.

In many of the described embodiments, the p+ region can be replaced by a Schottky contact and/or the n+ region can be replaced with a metal ohmic contact. In the case where a Schottky contact is used in combination with a III-V process technology, an extra wide energy-gap layer can be interposed between the metal and the n-doped semiconductor in order to reduce the current leakage associated with the Schottky contact.

All the described embodiments can be built in many different technologies, comprising: Bulk, Silicon On Insulator, Silicon On Sapphire or III-V technology with or without hetero-junctions. It is important to notice that a transcap device can also be utilized as a simple varactor by short-circuiting the CTRL terminal with the C1 (or C2) terminal.

All the embodiments illustrated above can be realized as both discrete or integrated components with minimal changes. For each one of them, the dual version can be obtained by simply substituting the n-doped implants with p-type ones and vice-versa. Many other configurations can be obtained combining the different embodiments and their variants.

Most of the structures described above can be realized with a standard SOI or bulk CMOS process. The distance between the doping implants and the upper capacitance electrode C1 can be omitted by auto-aligning the implantations with the MOS structure or can be obtained by adding two spacers to the structure during the fabrication process. In some of the embodiments, one or more extra process steps can also be required in order to form the pillars in the silicon substrate (by means of a silicon etching or a deposition process steps) and/or to obtain the buried implantation region at the beginning of the MOS process.

The parasitic capacitances between the control terminal and the other terminals of the capacitor play a very important role in the overall device performance. In fact, if a DC voltage is applied between the control terminal and the reference terminal C2, the control terminal may be considered AC shorted with the reference terminal. This effect reduces the capacitance seen from C1 to the parallel of the capacitance C1-C2 (between the main two terminals) with the parasitic capacitance C1-CTRL (between the control terminal and the non-reference terminal). The net adverse effect may be a significant reduction of the tuning range.

To reduce this effect it may be convenient to connect an impedance (e.g. a resistor and/or an inductor) of proper value in series to the control terminal to DC decouple the control terminal from the DC voltage source so that the mentioned parasitic capacitance does not end up being AC coupled in parallel to the main capacitance. However this control technique may cause the control voltage to vary with the RF signal and, as a consequence, the capacitance value of the capacitor to be modulated with the signal itself.

If the capacitance value varies with the control voltage in analog fashion, the consequence can be a non-negligible distortion of the signal. In this case the distortion can be however minimized by increasing the parasitic capacitance (or adding an external capacitance) between the control terminal and the reference terminal, or by using a pre-distortion signal to control the transcap device.

FIG. 30 illustrates the most conventional control configurations of an analog transcap. As shown in FIG. 30 (a), a high value resistor HR can be placed in series to the Ctrl terminal in order to bias the device control terminal without affecting the RF performance of the device.

FIG. 30 (b) shows a possible variant of this configuration, where two anti-parallel diodes have been inserted in series to the high impedance HR in order to increase the AC decoupling between the analog bias and the control terminal of the transcap device. A similar approach can be utilized for all the control configurations herein disclosed. Furthermore, the HR resistor can also be replaced with an inductor as shown in FIG. 30 (c).

As it can be seen, the conventional control configurations have several drawbacks: i) it is preferable to have the C2 terminal of the transcap connected to ground to avoid complicated control configurations, ii) the control voltage is negative (when an n-region is used underneath the C1 terminal), iii) the RF signal drops entirely across C1 and C2 limiting the linearity of the system, iv) the RF signal can partially propagate through the control terminal leading to distortion.

Some of these problems can be solved by adding a series capacitor $C_{series}$ between the transcap device and one of the RF terminals. In FIG. 31, is shown an example of implementation of this control configuration. In the illustrated case, the control terminal of the transcap device can be coupled through a high impedance to ground (or to a bias DC source), and the middle node (obtained by coupling the C2 terminal to the series capacitance) can be used to modulate the total capacitance seen by the RF signal, by applying a positive DC bias. This configuration is suitable for both shunt or series tuning capacitor configurations.

It is important to notice that, by utilizing the control configuration described above, the tuning range of the transcap device significantly increases. The DC control voltage not only modulates the depletion region of the pn junction between CTRL and C2, but also the carrier population at the oxide/semiconductor interface underneath the C1 terminal. A DC voltage is present also across the oxide layer allowing for a higher control on the overall capacitance between C1 and C2. In this configuration the C1 terminal of the transcap device can be biased through a third high impedance (not shown in figure) in order to guarantee the correct operation of the structure.

An even better performing approach is shown FIG. 32 (a), where two transcap devices TC1 and TC2 are connected back-to-back and the control terminals Ctrl1 and Ctrl2 are biased through two high impedances. The middle node obtained by coupling the two C2 terminals becomes therefore a third control terminal, which can also be used to modulate the capacitance seen by the RF signal. Also in this case, the RF terminals of the transcap device can be biased through high impedances (not shown in figure) in order to guarantee the correct operation of the transcap devices.

As shown in FIG. 32 (b) the differential series resulting from the connection back-to-back of two transcap devices can be seen as a single device with 5 terminals (RF+, RF−, C2, Ctrl1, Ctrl2), where two of them (RF+ and RF−) are dedicated to the RF signal and three (C2, Ctrl1, and Ctrl2) are used to modulate the capacitance value seen between RF+ and RF−. Hereafter, when possible, the symbol shown in FIG. 32 (b) will be utilized to represent the described 5 terminal differential series transcap device (DS Transcap) in order to simplify the circuit schematic.

FIG. 33 shows an example of implementation of the described series approach, where two transcap structures resembling the one of FIG. 1 have been connected back-to-back in series to form a 5 terminal device. Another example of implementation of a DS transcap device obtained from the structure of FIG. 15 is reported in FIG. 34.

FIG. 35 illustrates another possible implementation of the series approach by using the building block of FIG. 22. It is important to notice that the differential-series configuration can be utilized with all the transcap structures herein described and their variants, by connecting two of them back-to-back in series. In general, the ratio between the two transcap structures composing the differential-series configuration can be made different from the unity in order to cancel or minimize distortion effects, and improve the linearity of the system.

Another interesting implementation of the differential-series approach is shown in FIG. 36, where the C2 implantation 318 has been placed before the two RF terminals 313 and 322. In this structure a buried n+ implantation 317 has been added in order to decrease the parasitic resistance associated with the C2 terminal. However, as previously discussed for the other embodiments, this buried implantation is optional.

FIG. 37 shows two possible control configurations that can be used to bias the different terminals of a 5 terminals DS transcap device. As it can be seen, in both configurations, the Ctrl1 and Ctrl2 terminals have been coupled to ground through high impedances, and the central control terminal C2 has been used to modulate the device capacitance between RF+ and RF−terminals. For each device terminal, a MOS transistor can also be connected in parallel to the high impedance HR in order to speed up the tuning speed of the transcap device (i.e., for example, the MOS devices are always off except during the transitions of the control voltage). FIG. 38 illustrates the resulting CV characteristic obtained with one of the described DS devices.

Due to the differential nature of a differential-series configuration, the distortion induced by the presence of the parasitic capacitances between the Ctrl1 and Ctrl2 terminals and the RF terminals, is minimized. The RF signal propagates both in the C2 terminal and in the Ctrl1 and Ctrl2 terminals, such as its net effect on "$V_{CTRL}$-$V_{C2}$" is minimized for both transcaps composing the differential-series.

In principle, the Ctrl1 and Ctrl2 terminals can also be shorted together, however this approach can significantly degrade the device tuning range, especially in the case where the capacitance between Ctrl and C2 (and/or between Ctrl2 and C2) is comparable to the one between C2 and RF+ (and/or between C2 and RF−) as in the case of an SOI process with a thin silicon active layer (in this case, the shortening of the two controls terminals Ctrl1 and Ctrl2 can decrease the tuning range by a factor greater than 2).

As shown in FIG. 39, by using the control configurations of FIG. 37, more structures can be placed in series by short-circuiting the resistors coupled to the C2 terminals, in order to withstand higher RF voltages.

As shown in FIG. 40, multiple differential-series devices can also be places in parallel (or anti-parallel). In this case, the dimensions of the 4 transcaps can be optimized in order to optimize the linearity of the system, for example by sizing the $1^{st}$ transcap in order to match the dimensions of the $4^{th}$ one, and by sizing the $2^{nd}$ to match the $3^{rd}$ one so as to obtain an anti-parallel configuration. If desired, the two analog controls can be coupled together in order to simplify the driving circuitry.

FIG. 41 illustrates another interesting control configuration, where a hybrid approach between analog and digital solution is presented as a switch is placed in series to the described variable capacitor. In this configuration, the size of the transistor M1 must be opportunely chosen in order to maximize the tuning range, maintaining, at the same time, the possibility of choosing, in a continuous fashion, all the possible capacitance values in the selected tuning range.

The modus operandi of this configuration is quite simple. Referring to FIG. 41 (a), the minimum capacitance value (seen from the RF signal) is obtained when the transistor M1 is turned off, and the analog control terminal of the transcap device is biased at high negative voltages so as to minimize the capacitance value between C1 and C2. The maximum capacitance value, instead, is obtained when M1 is turned-on and the analog control voltage is set to zero. The intermediate capacitance values can be obtained by turning-on or off M1, and by varying the analog control voltage fed to the analog control terminal. Similar considerations hold true also for the configuration of FIG. 41 (b), where a DS transcap has been placed in series to a MOS device.

In order to better understand how this configuration works, in FIG. 42 is illustrated one example of CV characteristic obtained with the described control configuration of FIG. 41 (b). In the x-axes the reference voltage is shown (which is used only as a reference for the plot, since the analog control voltage is increased from positive values to 0V for each combination of Digital Ctrl analyzed).

The transistor M1 can also be replaced with a multiplicity of transistors (connected in series or in parallel to each other). In this case, by properly choosing the ratio between the different components of the network, it is possible to increase the tuning range of the network.

FIG. 43 illustrates another interesting configuration, where two of the previous networks have been connected in parallel.

In this configuration, the devices belonging to the second branch of the parallel (DS transcap 2 and M2) must be opportunely sized in order to increase as much as possible the capacitance tuning range, maintaining at the same time the possibility of choosing in analog fashion all the possible capacitance values in the selected tuning range.

The operation of this configuration is similar to the one of the network shown in FIG. 41. The minimum capacitance value (seen from the RF signal) is obtained when both transistors M1 and M2 are turned off, and the analog control terminals of the two DS transcap devices (which are short-circuited through two high impedances in order to simplify the overall control circuitry) are biased at high positive voltages so as to minimize the capacitance values of DS Transcap 1 and DS Transcap 2. The maximum capacitance value, instead, is obtained when both transistor M1 and M2 are turned-on and the analog control voltage is set to zero. The intermediate capacitance values can be obtained tuning-on only M1, only M2, both or none of them, and varying the analog control voltage.

If the dimensions of the two transistors M1 and M2 and the size of DS Transcap 1 and DS Transcap 2 are opportunely chosen, for example such as M2 and DS Transcap 2 are both r times bigger than M1 and DS Transcap 1, respectively, all the intermediate capacitance values can be chosen in an analog fashion way.

In FIG. 44 is shown how to control the described configuration in order to achieve all the intermediate values in the whole tuning range. In this particular example, the size of two transistors M1 and M2 has been chosen such as when one of the two is turned-off its respective branch does not influence much the total capacitance value. In this case therefore, the configuration where both transistors M1 and M2 are turned-off has been excluded from the analog tuning range analyzed. Also in this case, as in FIG. 42, in the x-axes a reference voltage which is used only as a reference for the plot is shown, since the analog control voltage is increased from positive values to 0V for each combination analyzed of the digital controls Digital Ctrl1 and Digital Ctrl2.

It is important to notice that, if desired, the two analog controls of the two transcap devices can be separated and driven independently. Furthermore, more capacitive branches can be coupled in parallel using a similar configuration.

In all the configurations described above, the capacitance between the control terminal of each transcap device and the C2 terminal can be increased in order to improve the linearity of the overall network. Alternatively, external or integrated capacitors can also be added in order to increase the C2-CTRL capacitances. In particular with the differential series approach, external or integrated capacitors can be added between the two control terminals or between each control terminal and the central node of the series, in order to improve the linearity of the system.

As mentioned above, also a digital approach can be utilized. In this case, many small variable capacitors are connected in parallel, and each transcap device is switched in a digital way between a high and a low capacitance value in order to obtain the desired total capacitance value.

Given n capacitors in parallel, if each of them is opportunely sized (the i-th capacitor is $2^{i-1}$ times the first one), the total number of capacitance values that can be obtained is $2^n$. Therefore, as an example, if each capacitor has a tuning range of 1:10 and the maximum total capacitance is 10 pF, with 5 capacitors it is possible to obtain 32 capacitance values, corresponding to a discretization step of 0.3125 pF.

As it is clear to those skilled in the art, the basic system of the present invention can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

Figure 7:
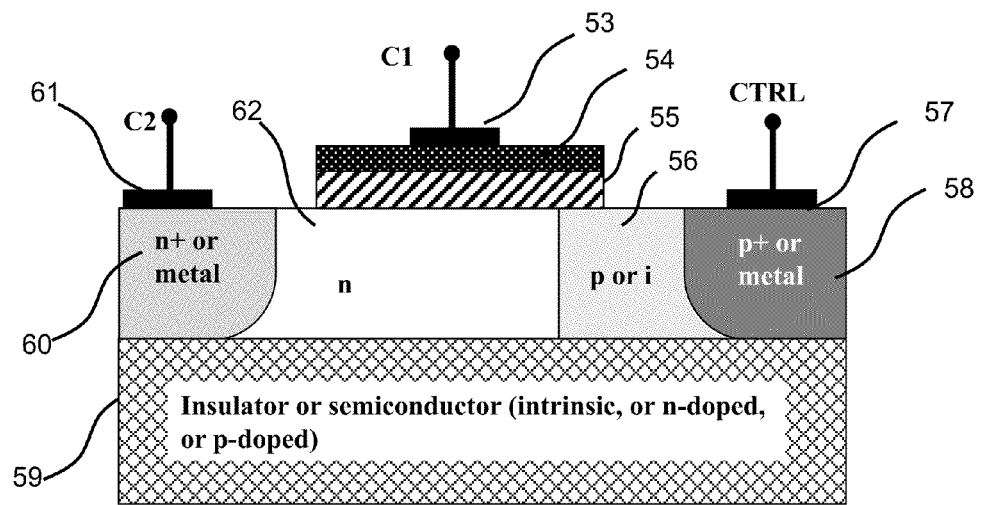

FIG. 7 shows a cross section view of a semiconductor variable capacitor according to a further embodiment of the invention, where a p-doped (or intrinsic/near-intrinsic) region has been interposed between the n-doped region underneath the C1 oxide and the control region in order to increase the breakdown voltage of the control terminal and, at the same time, minimize the C1-CTRL parasitic capacitance.

Figure 8:
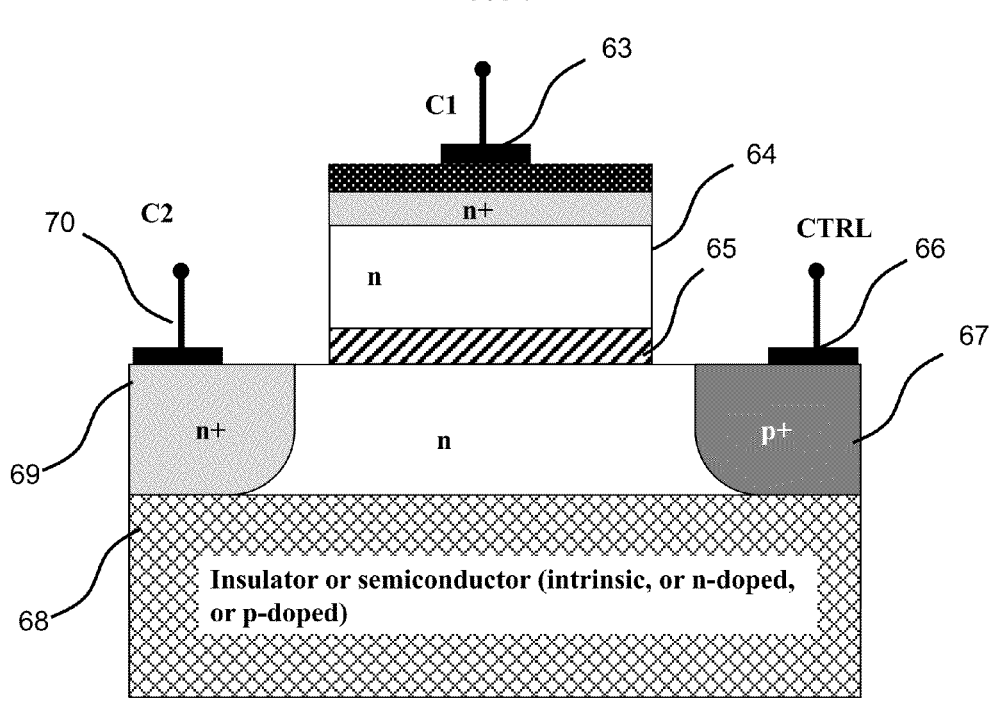

FIG. 8 shows a cross section view of a semiconductor variable capacitor according to a further embodiment of the invention, where the upper capacitance plate has been doped with the same doping concentration of the substrate.

Figure 9:
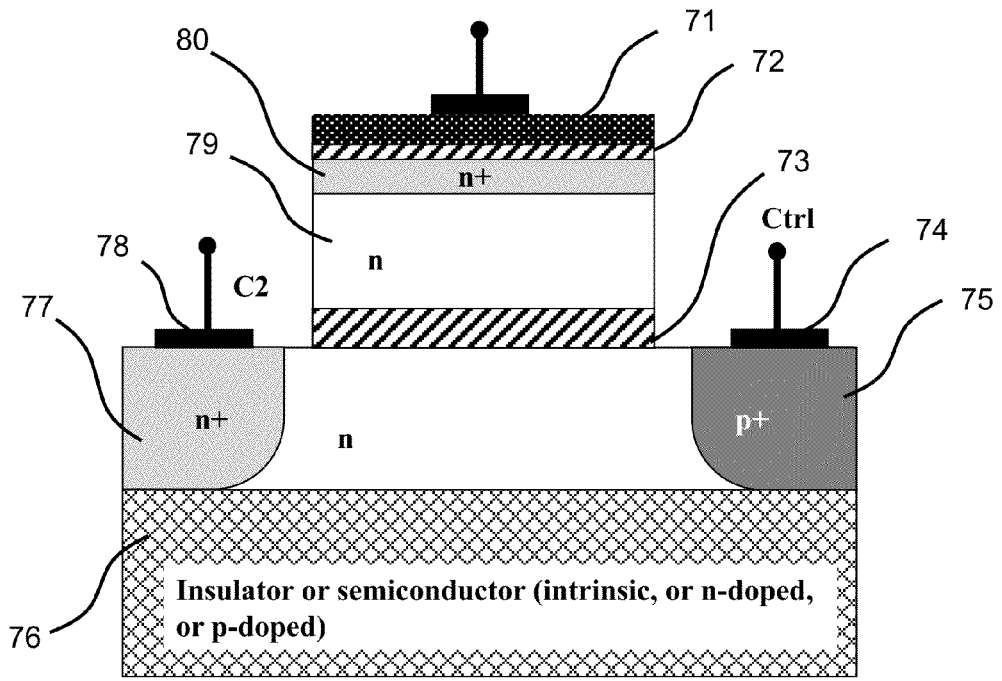

FIG. 9 shows a cross section view of a semiconductor variable capacitor according to a further embodiment of the invention, where an extra capacitor has been added on the top of the structure.

Figure 10:
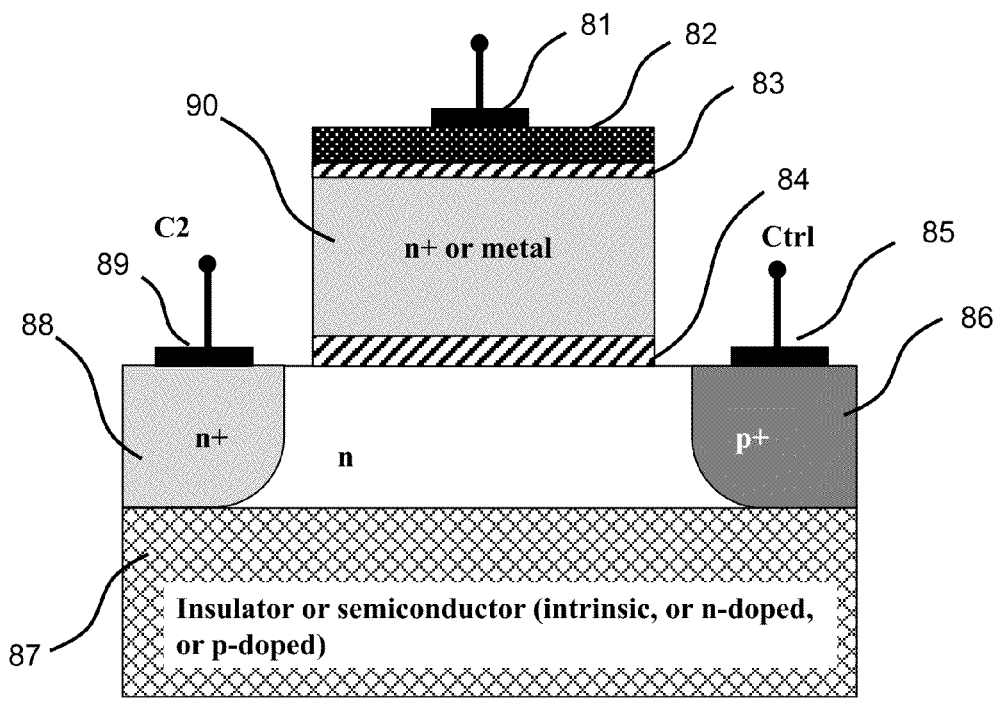

FIG. 10 shows a cross section view of a semiconductor variable capacitor according to a further embodiment of the invention, where a highly conductive plate has been interposed between the two capacitance dielectrics.

Figure 11:
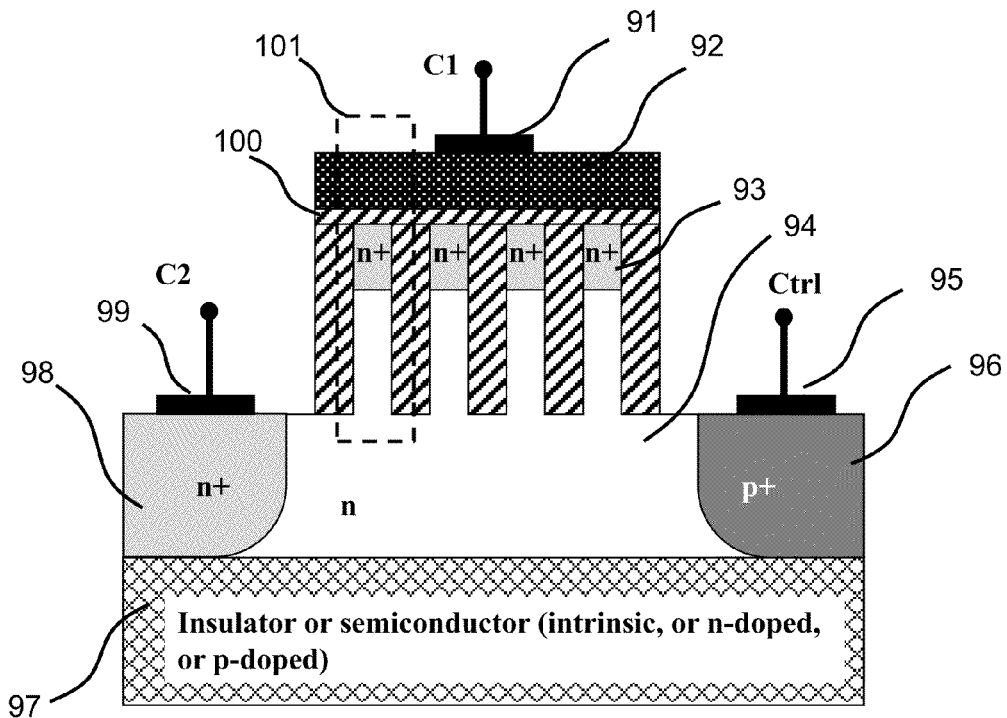

FIG. 11 shows a cross section view of a semiconductor variable capacitor according to a further embodiment of the invention, where a multiplicity of pillars has been used as lower equivalent capacitance plate.

Figure 12:
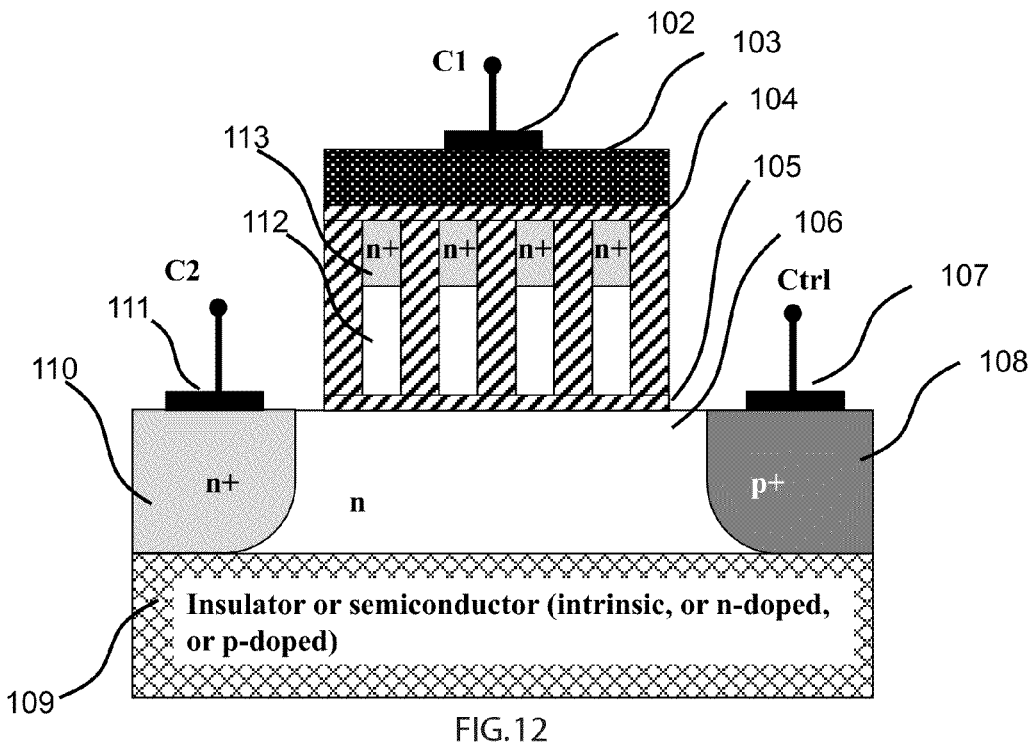

FIG. 12 shows a cross section view of a semiconductor variable capacitor according to a further embodiment of the invention, where an extra dielectric layer has been interposed between the multiplicity of pillars and the n-doped semiconductor layer in order to smooth out the CV characteristic of the device.

Figure 13:
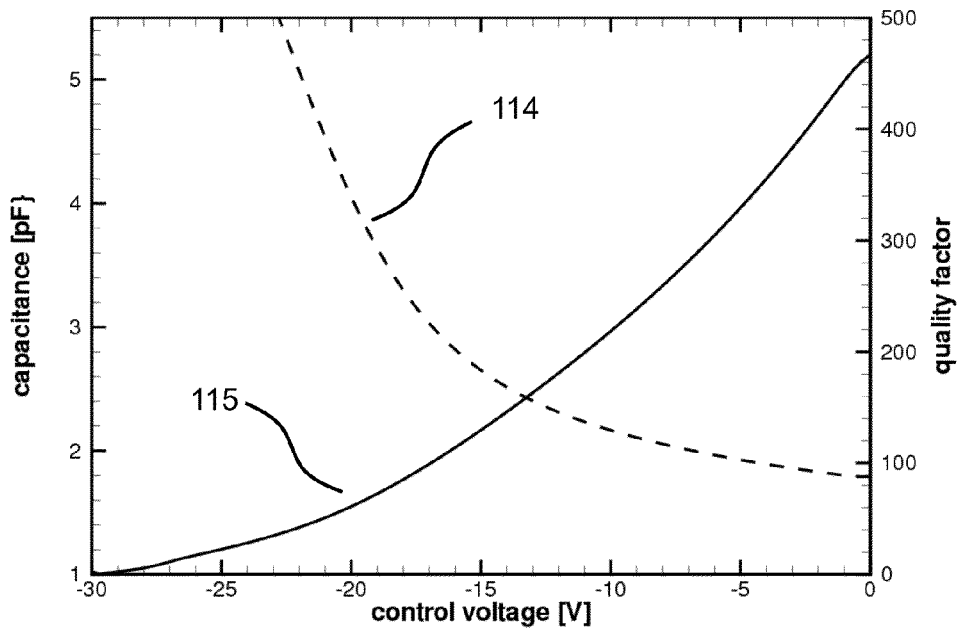

FIG. 13 shows the capacitance value and the quality factor as a function of the control voltage as obtained from the numerical simulation of the embodiment of the invention illustrated in FIG. 12.

Figure 14:
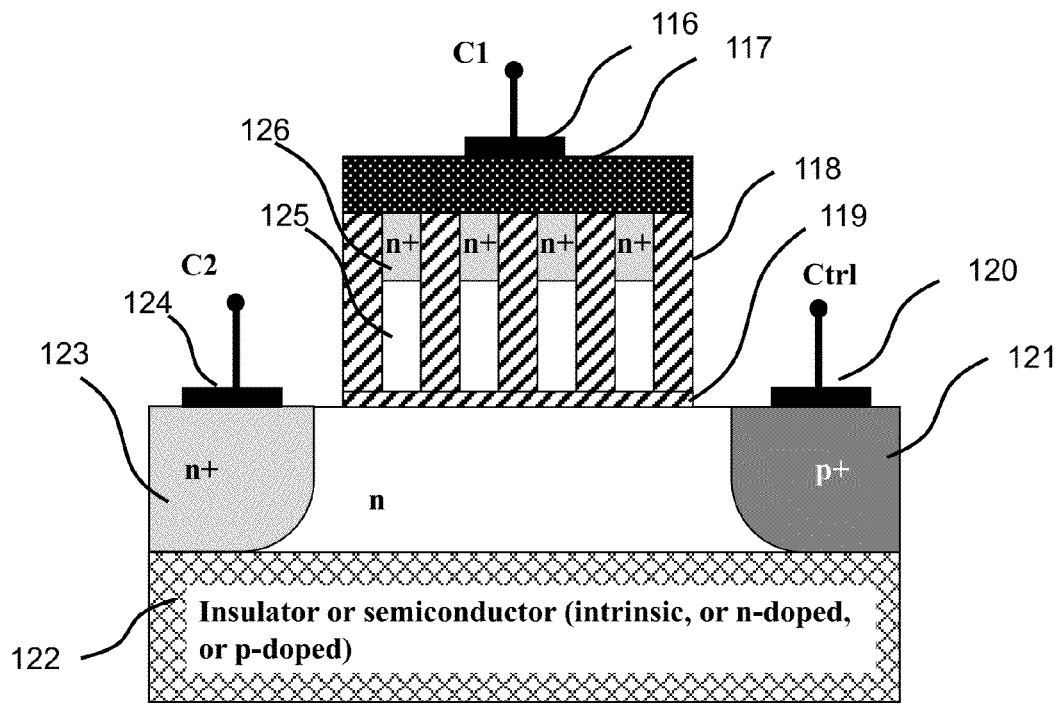

FIG. 14 shows a cross section view of a semiconductor variable capacitor according to a further embodiment of the invention, where a multiplicity of pillars has been used as upper equivalent capacitance plate.

Figure 15:
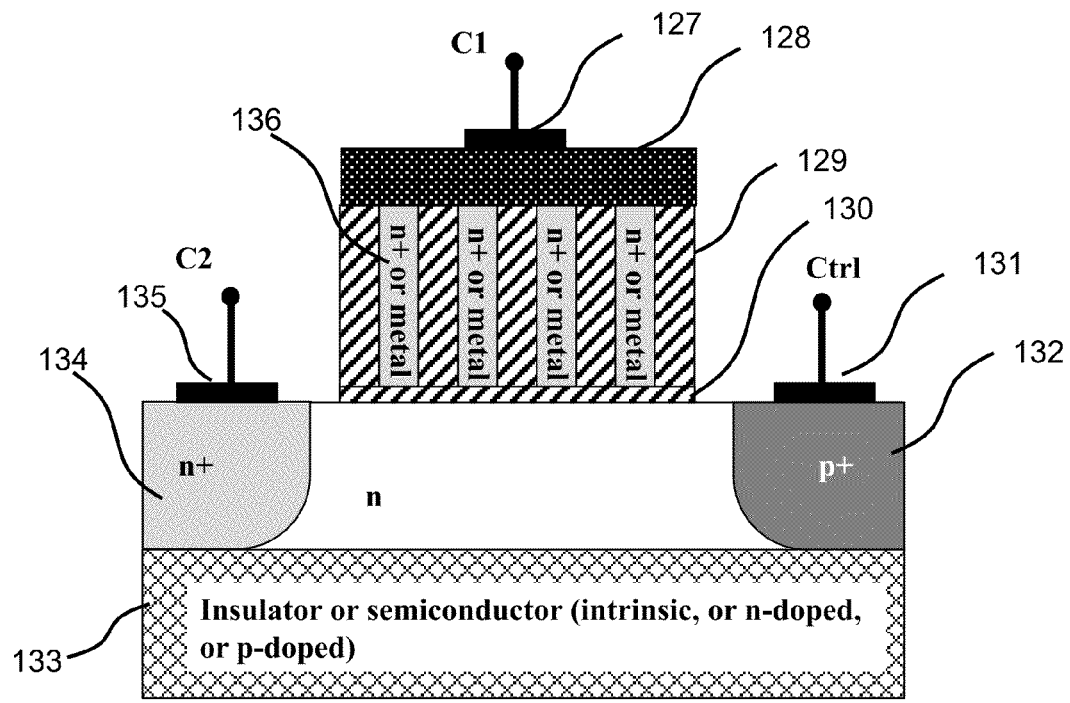

FIG. 15 shows a cross section view of a semiconductor variable capacitor according to a further embodiment of the invention, where a multiplicity of highly conductive pillars has been used as upper equivalent capacitance plate.

Figure 16:
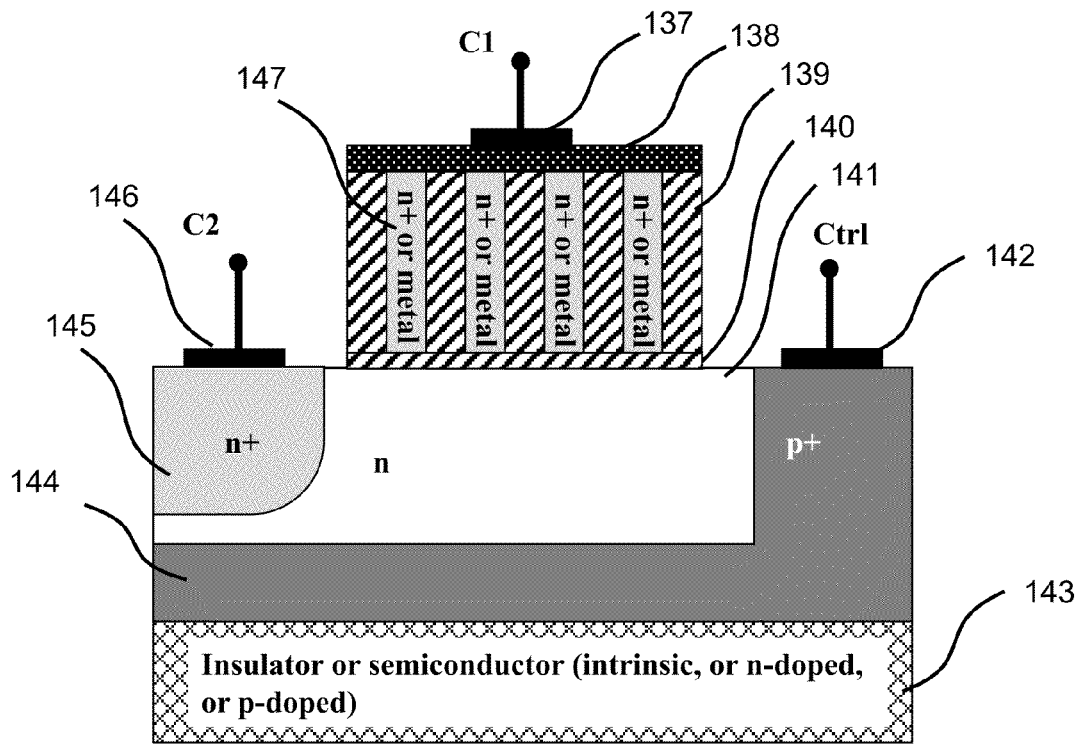

FIG. 16 shows a cross section view of a semiconductor variable capacitor according to a further embodiment of the invention, where a multiplicity of highly conductive pillars has been used as upper equivalent capacitance plate and a p+ buried implantation has been added to improve the control on the depletion region underneath the C1 oxide.

Figure 17:
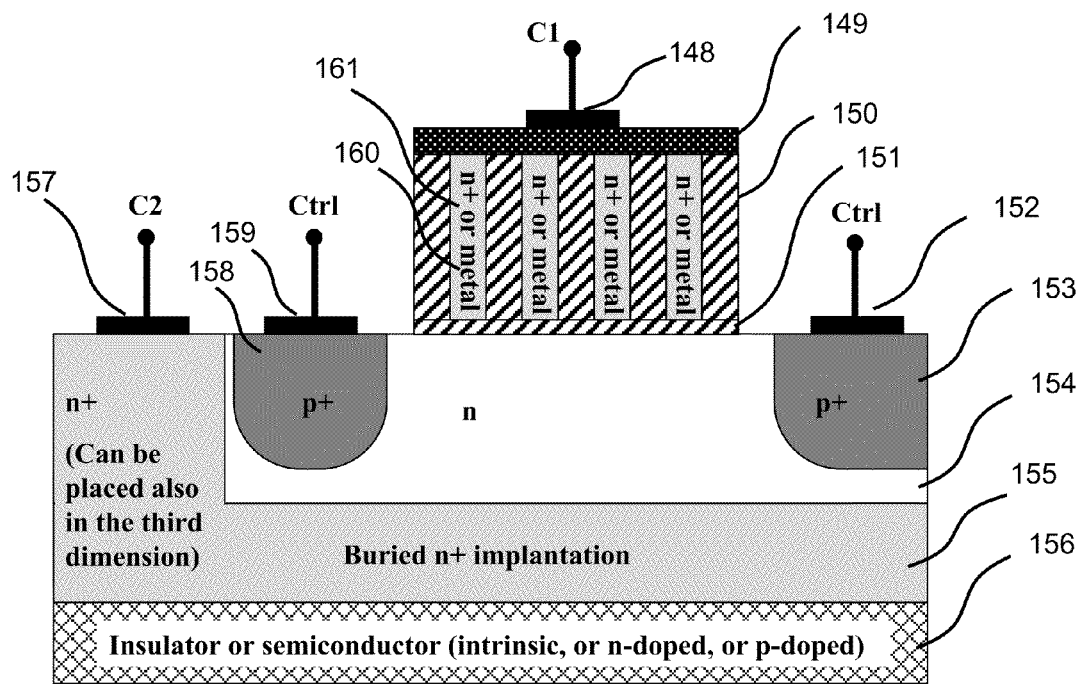

FIG. 17 shows a cross section view of a semiconductor variable capacitor according to a further embodiment of the invention, where a second control region and n+ buried layer have been added.

Figure 18:
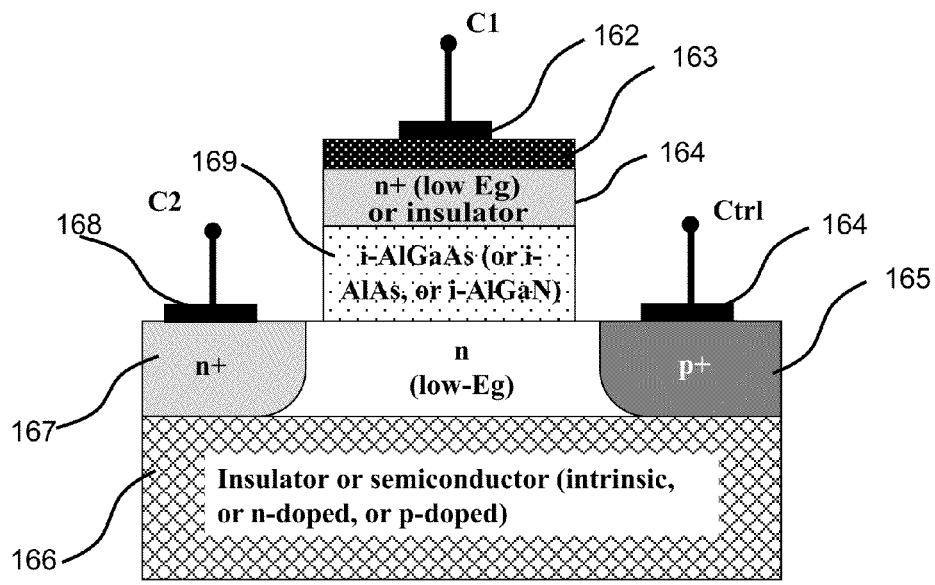

FIG. 18 shows a cross section view of a semiconductor variable capacitor according to a further embodiment of the invention, where the capacitance dielectric has been replaced with a wide band-gap material.

Figure 19:
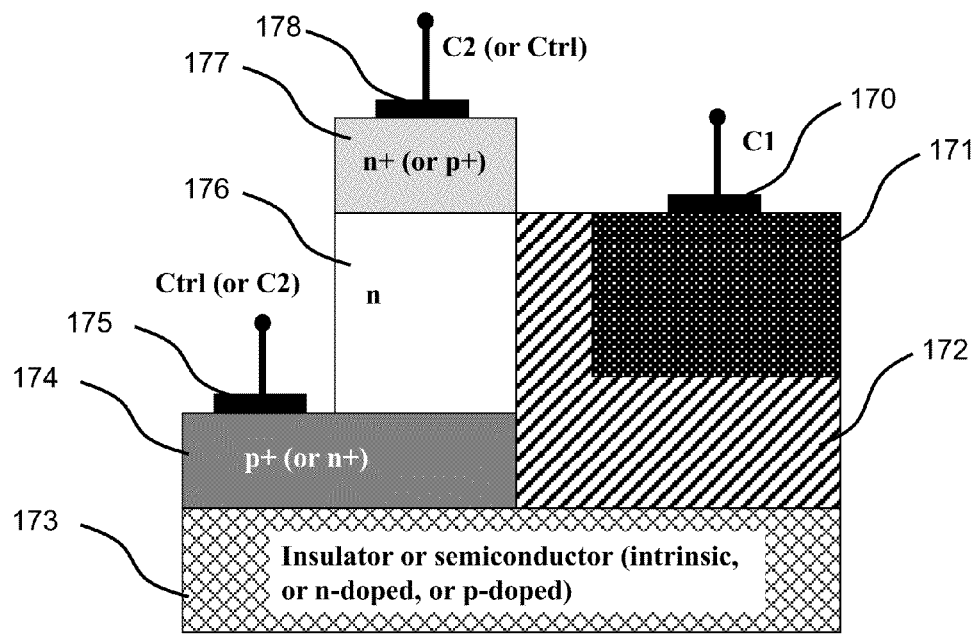

FIG. 19 shows a cross section view of a semiconductor variable capacitor according to a further embodiment of the invention, where the depletion region moves in the vertical direction with respect to the primary surface of the semiconductor substrate.

Figure 20:
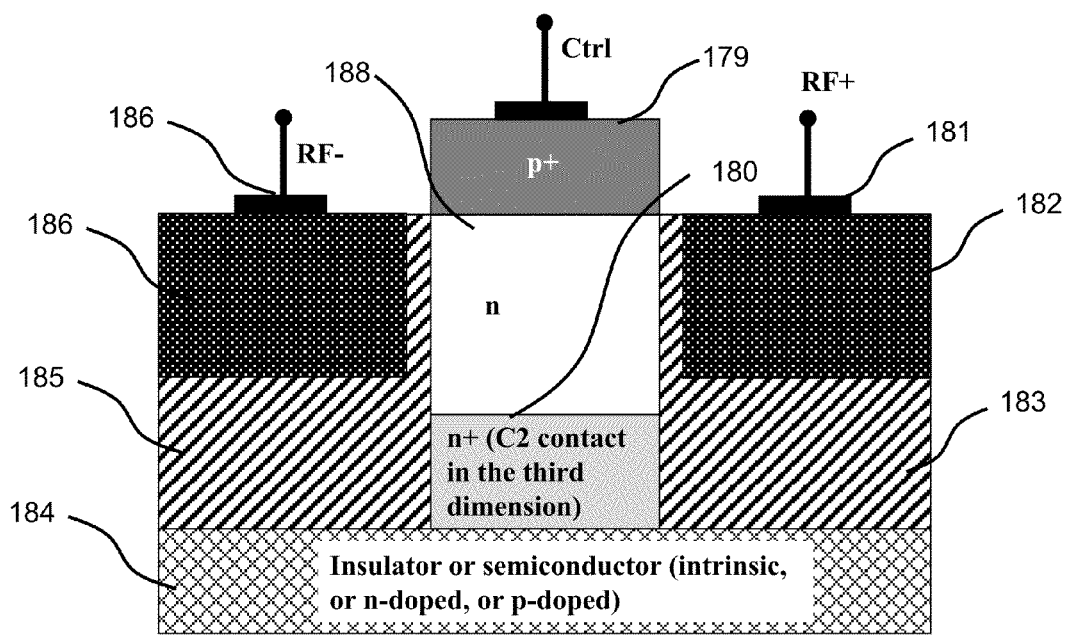

FIG. 20 shows a cross section view of a vertical semiconductor variable capacitor according to a further embodiment of the invention, where an extra terminal has been added in order to allow for an easy connection of the transcap structure in floating RF configuration.

Figure 21:
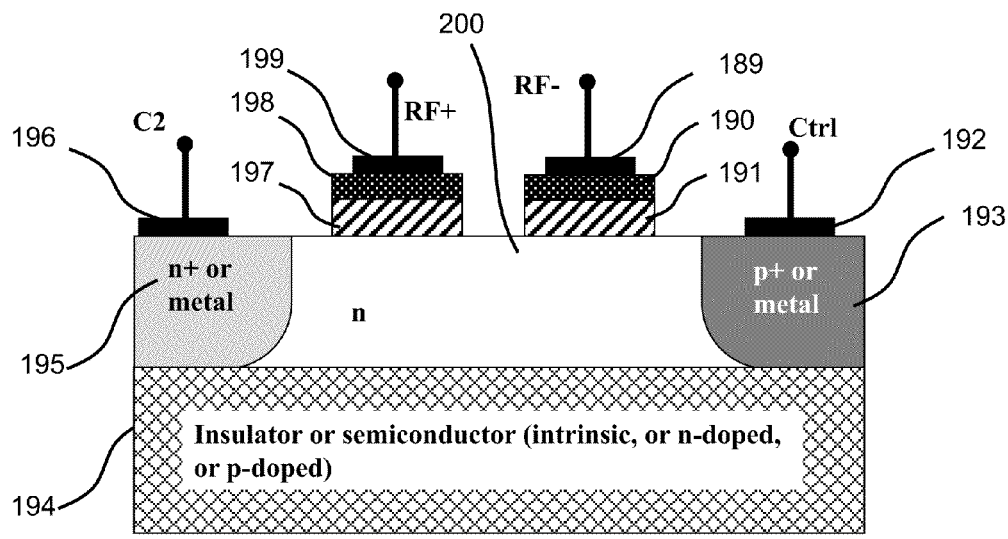

FIG. 21 shows a cross section view of a planar semiconductor variable capacitor according to a further embodiment of the invention, where an extra terminal has been added in order to allow for an easy connection of the transcap structure in floating RF configuration.

Figure 22:
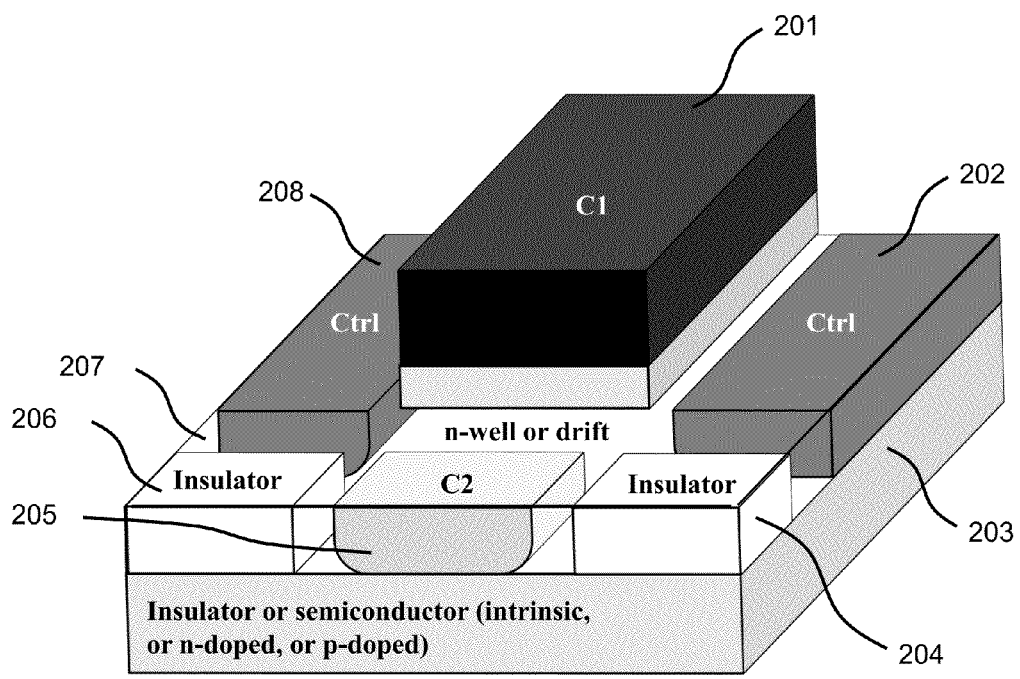

FIG. 22 shows a tridimensional view of a semiconductor variable capacitor with double control according to a further embodiment of the invention.

Figure 23:
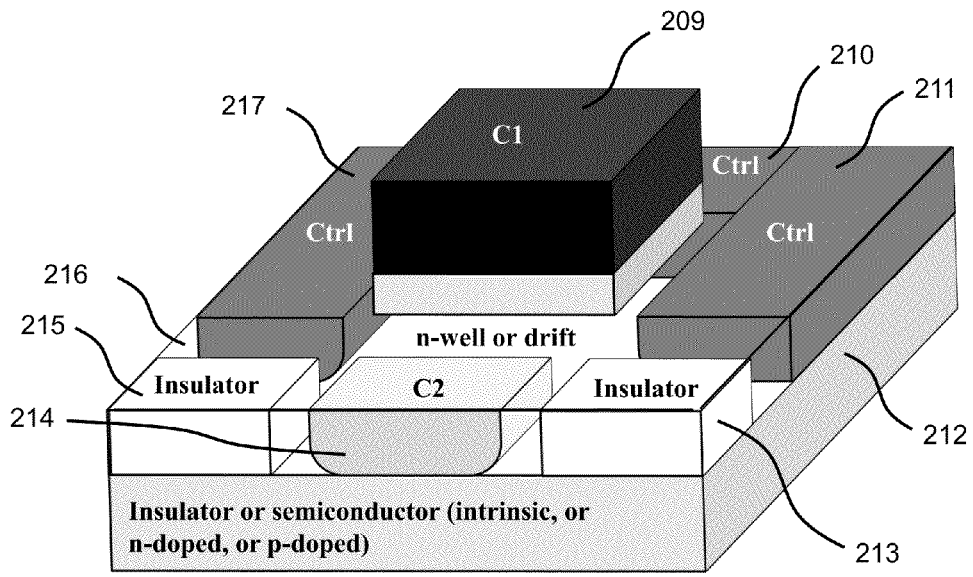

FIG. 23 shows a tridimensional view of a semiconductor variable capacitor with triple control according to a further embodiment of the invention.

Figure 24:
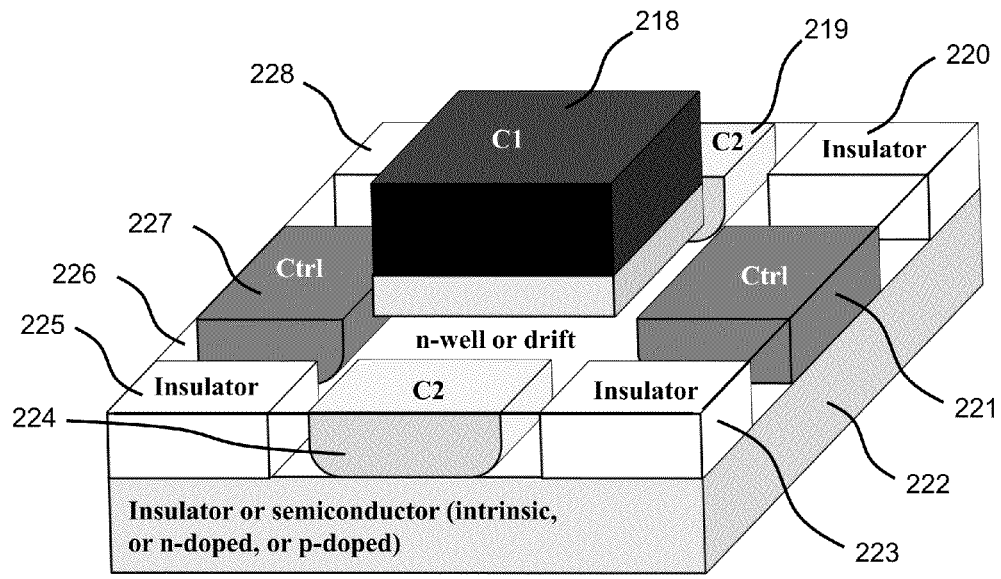

FIG. 24 shows a tridimensional view of a semiconductor variable capacitor with double C2 implantation according to a further embodiment of the invention.

Figure 25:
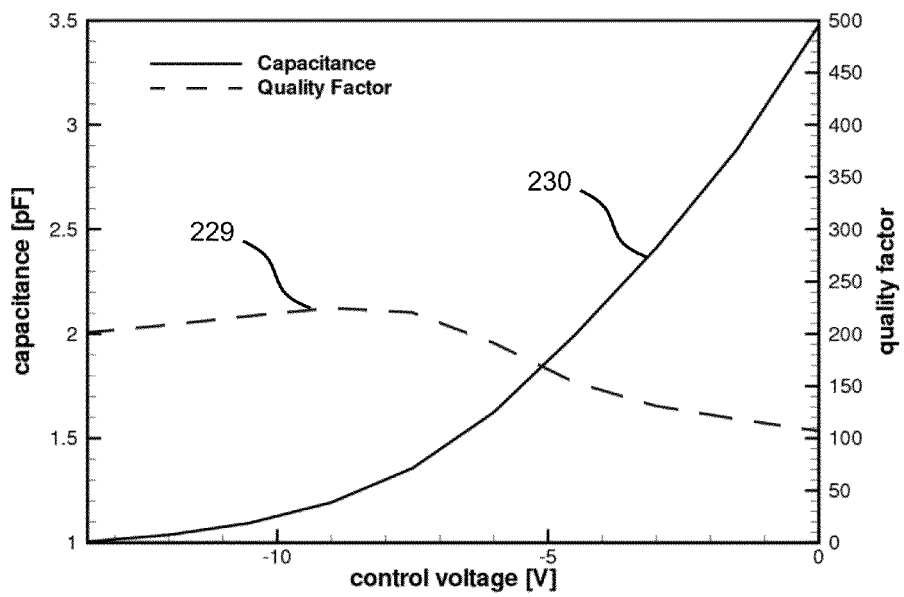

FIG. 25 shows the capacitance value and the quality factor as a function of the control voltage as obtained from the numerical simulation of the embodiment of the invention illustrated in FIG. 22.

Figure 26:
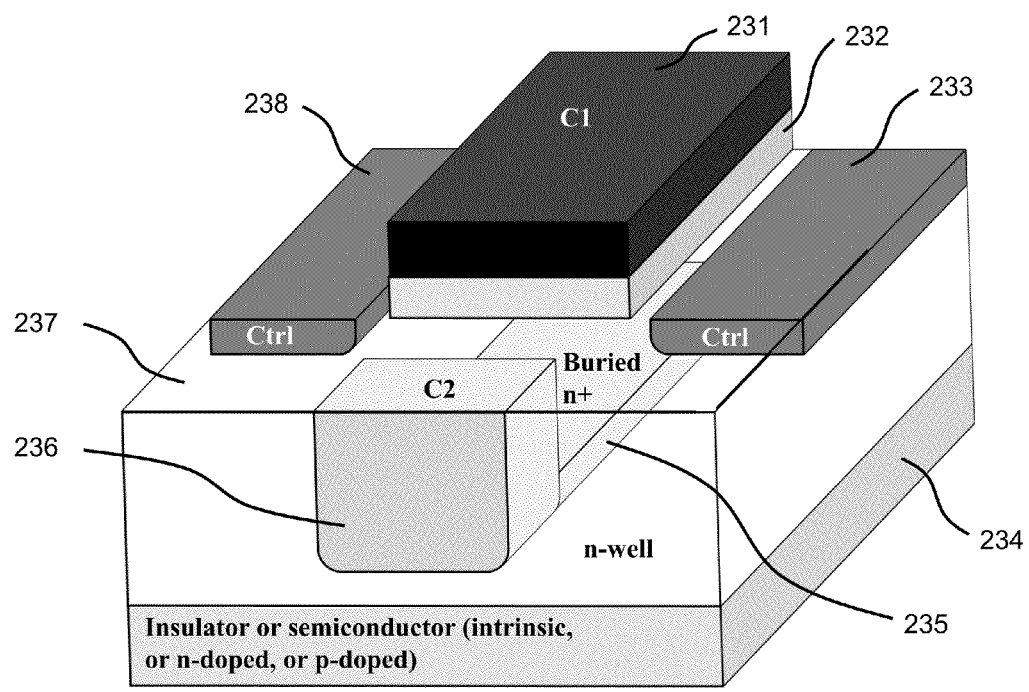

FIG. 26 shows a tridimensional view of a semiconductor variable capacitor with an n+ buried implantation according to a further embodiment of the invention.

Figure 27:
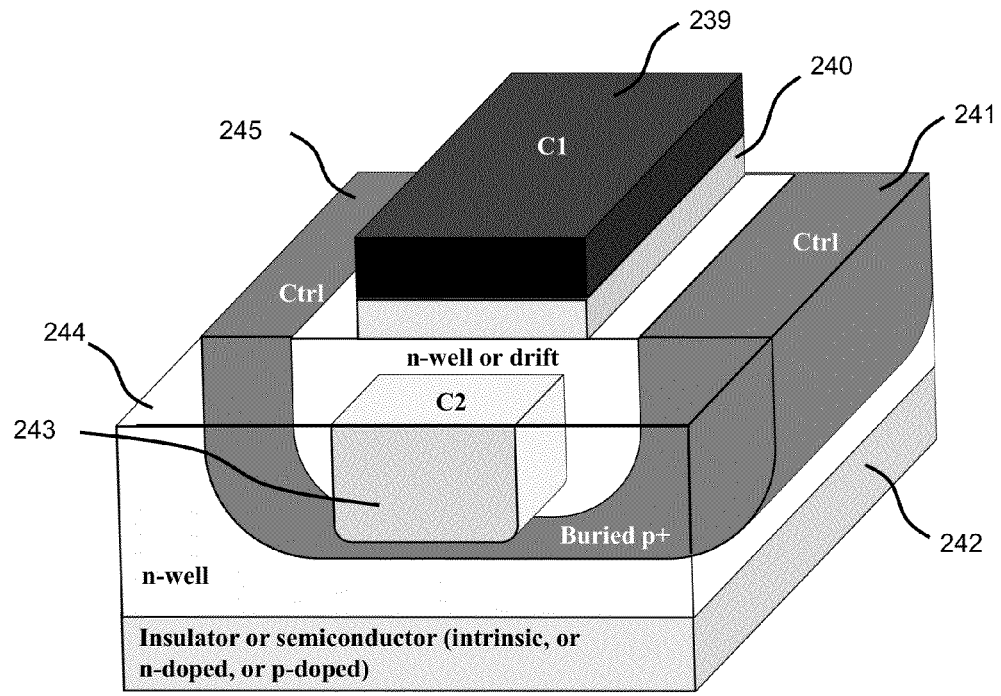

FIG. 27 shows a tridimensional view of a semiconductor variable capacitor with a p+ buried implantation according to a further embodiment of the invention.

Figure 28:
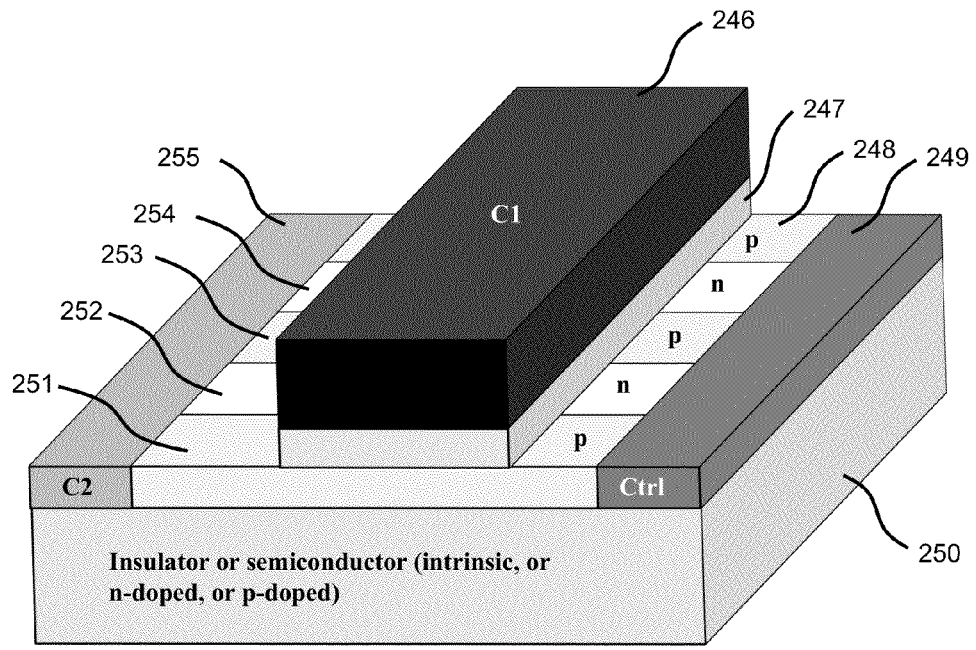

FIG. 28 shows a tridimensional view of a semiconductor variable capacitor with a super-junction profile according to a further embodiment of the invention.

Figure 29:
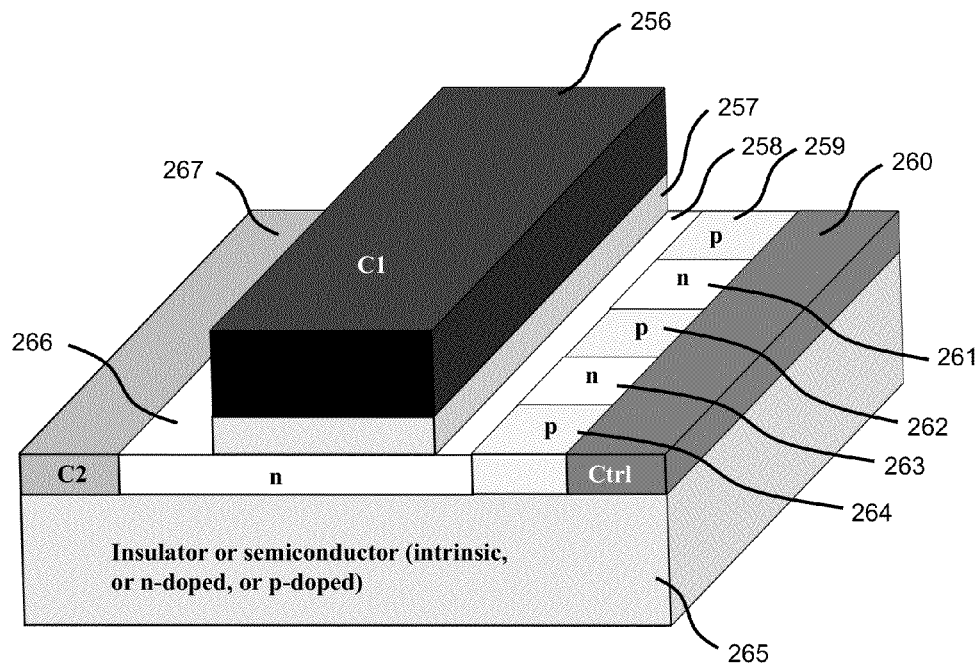

FIG. 29 shows a tridimensional view of a semiconductor variable capacitor with a super-junction profile only on one side of the structure according to a further embodiment of the invention.

Figure 30:
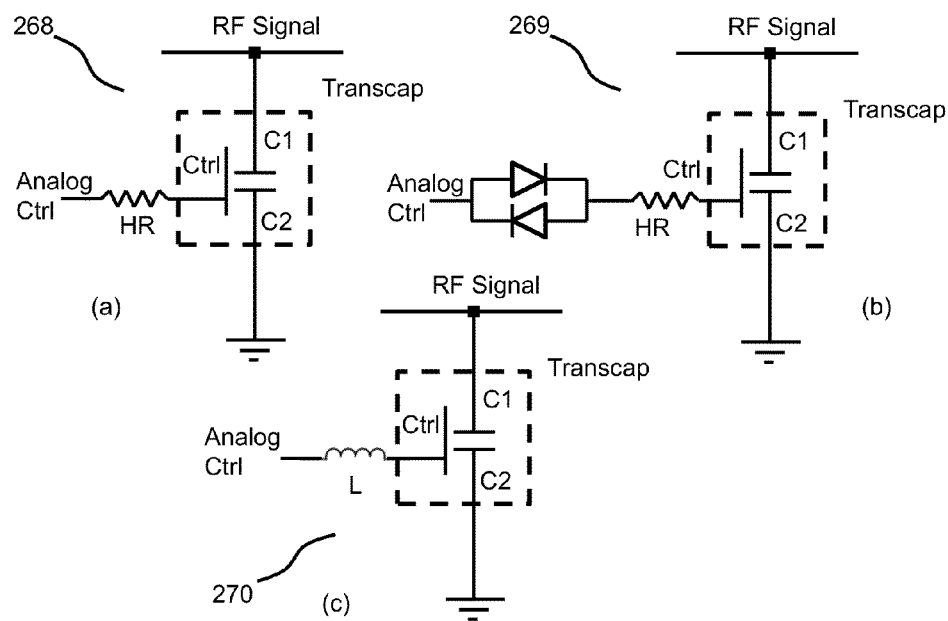

FIG. 30 shows three examples of control configuration for the transcap device.

Figure 31:
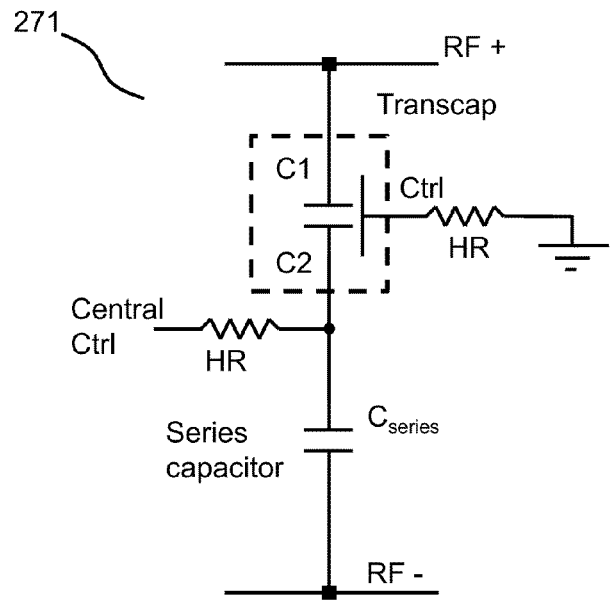

FIG. 31 shows a further example of control configuration for the transcap device.

Figure 32:
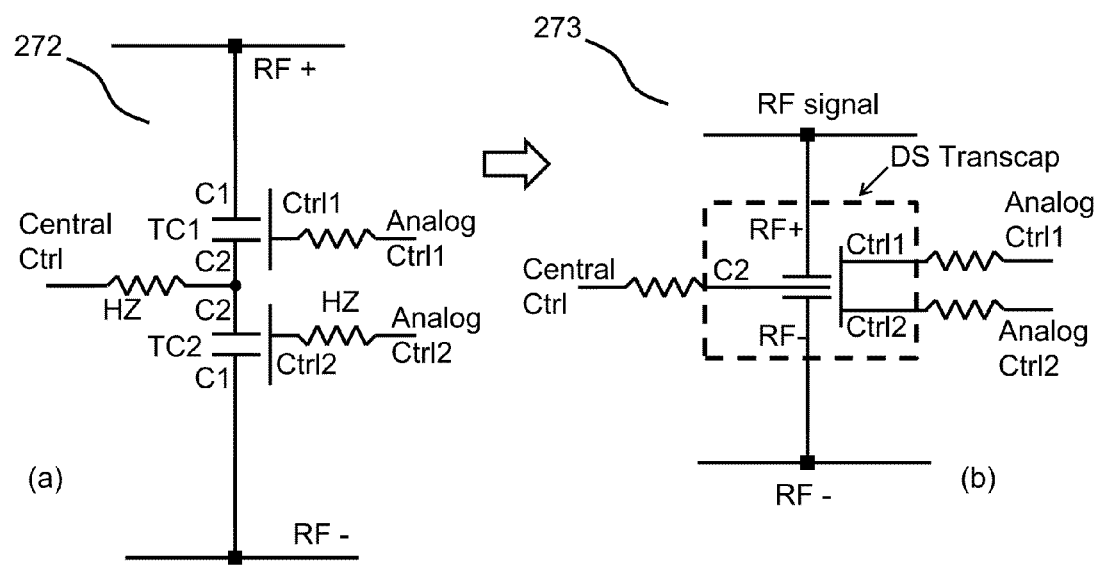

FIG. 32 shows a differential control configuration for the transcap device and the circuital symbol used to identify this particular configuration.

Figure 1:
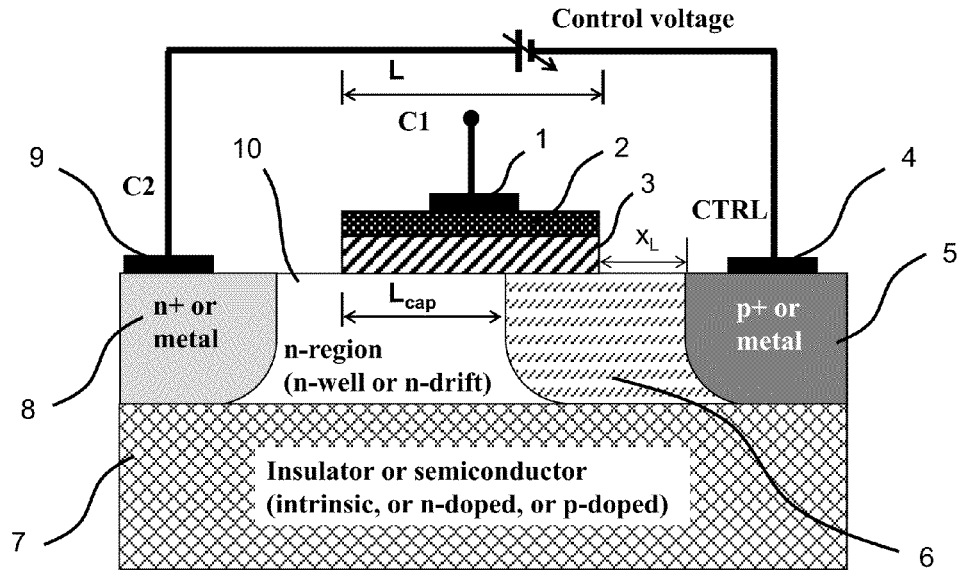
FIG. 1 shows a cross section view of a semiconductor variable capacitor according to the preferred embodiment of the invention.
Figure 33:
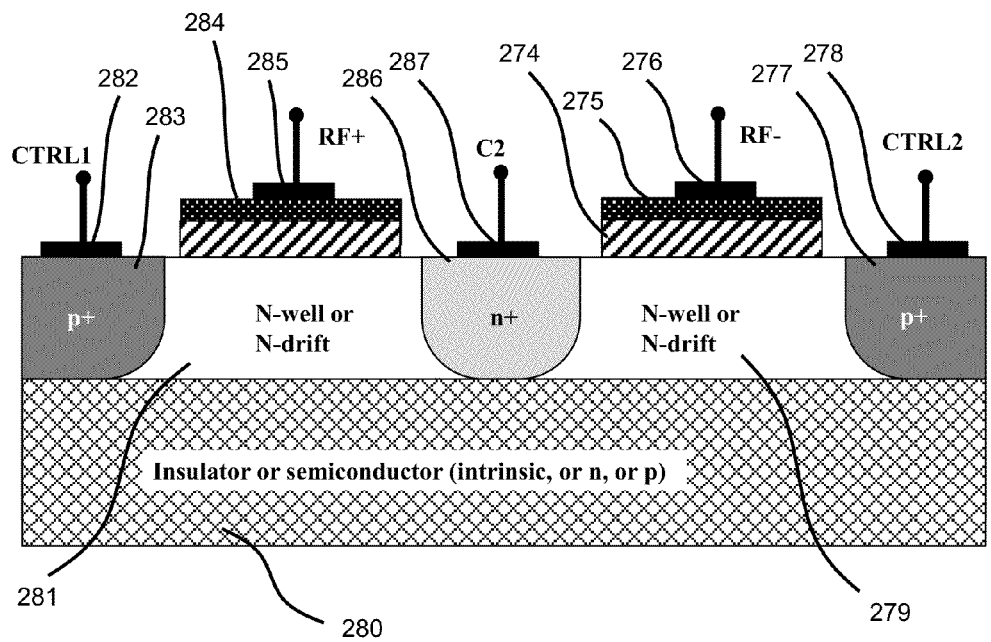

FIG. 33 shows an example of implementation of a 5 terminal differential-series transcap device realized using the device structure of FIG. 1.

Figure 34:
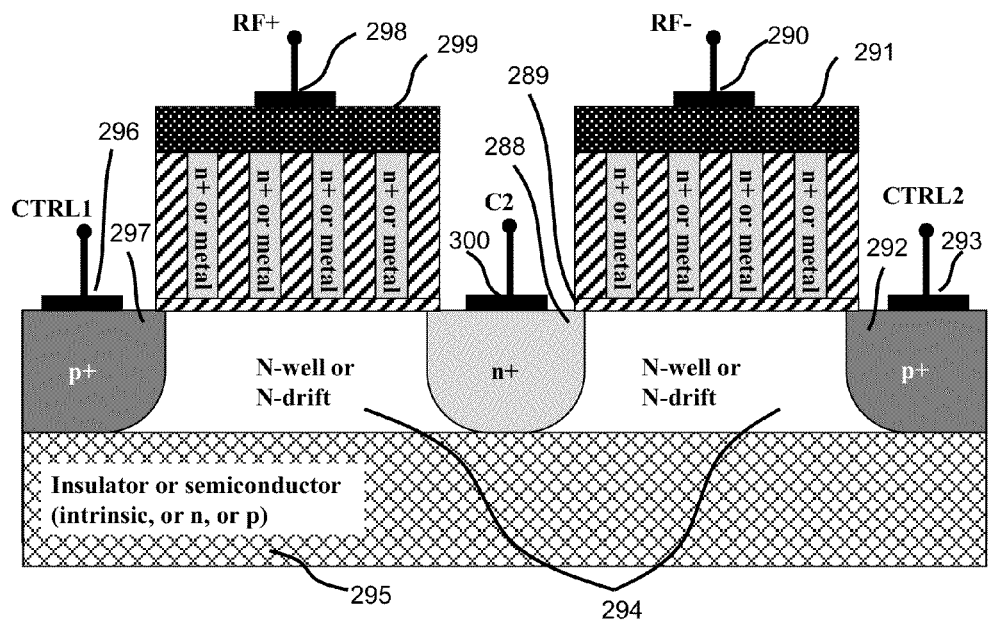

FIG. 34 shows a further example of implementation of a 5 terminal differential-series transcap device realized using the device structure of FIG. 15.

Figure 35:
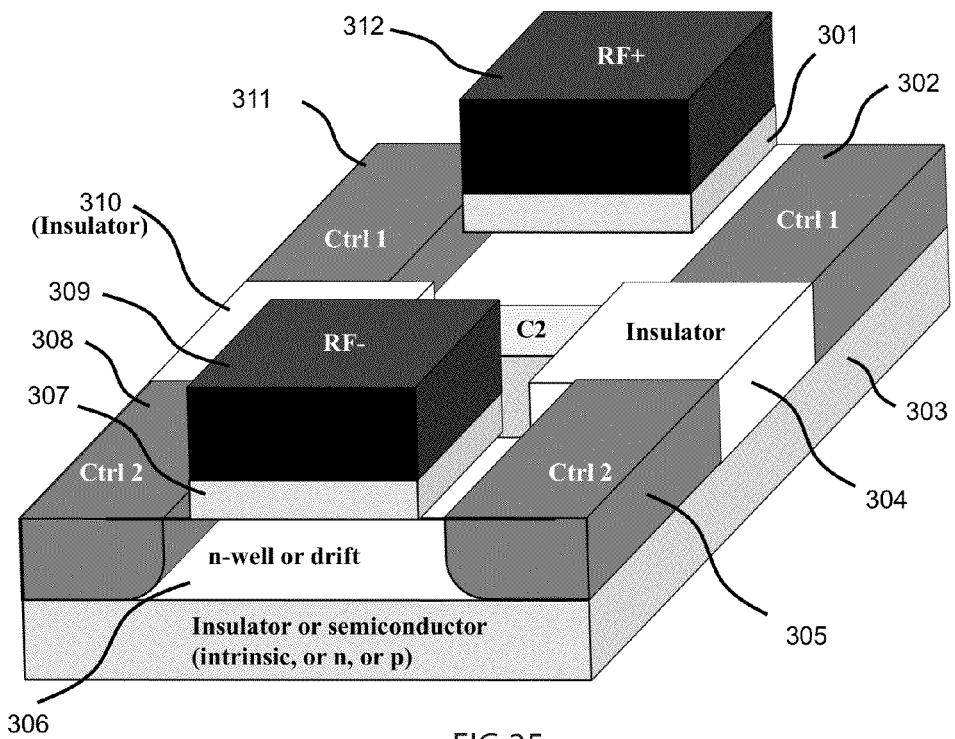

FIG. 35 shows a further example of implementation of a 5 terminal differential-series transcap device realized using the device structure of FIG. 22.

Figure 36:
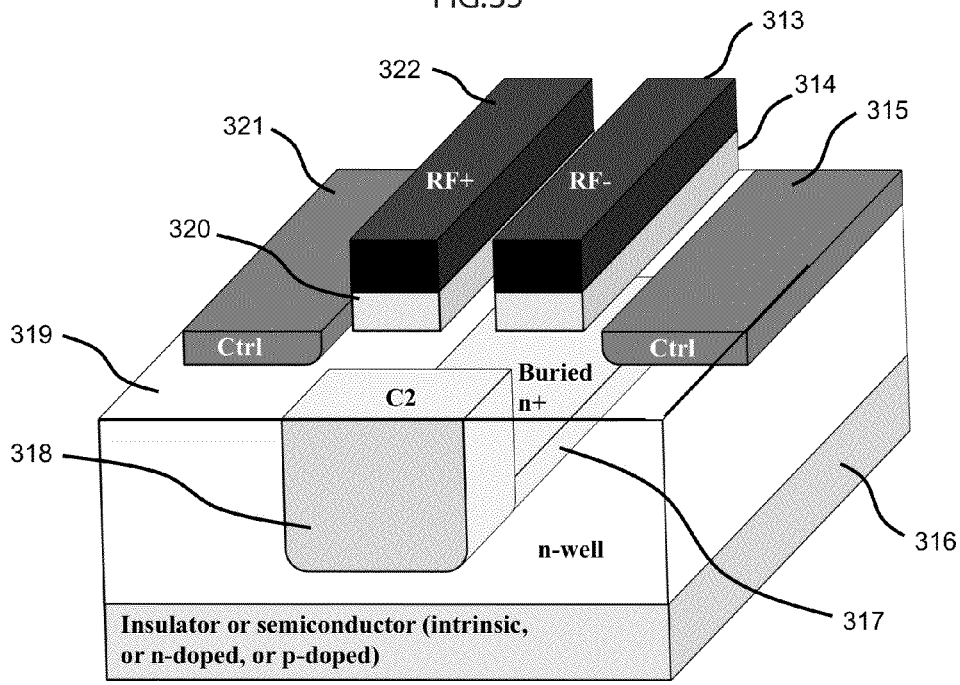

FIG. 36 shows a further example of implementation of a 5 terminal differential-series transcap device realized by placing the C2 implantation before the RF terminals.

Figure 37:
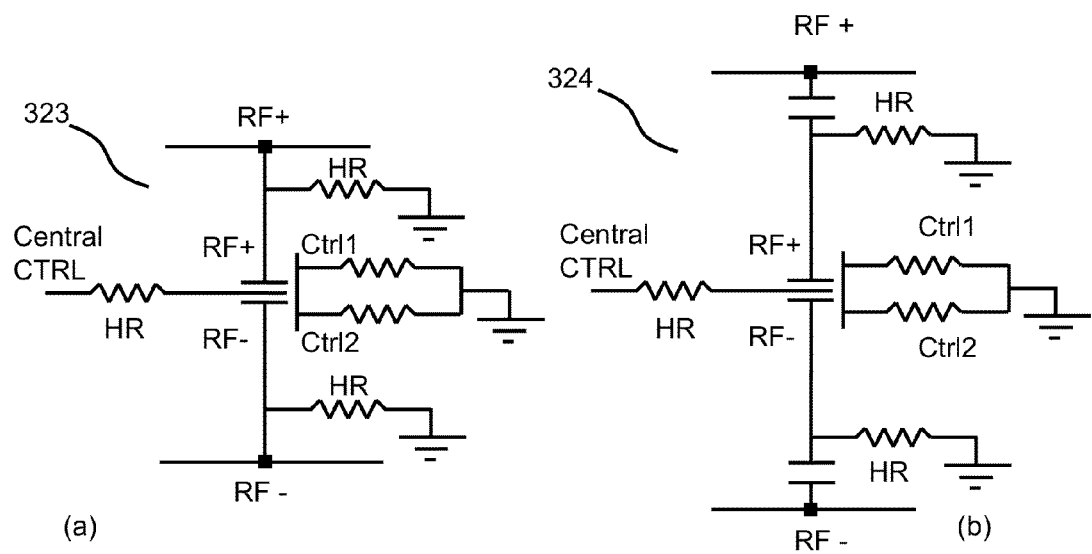

FIG. 37 shows a couple of examples of biasing configurations for a 5 terminal differential-series transcap device.

Figure 38:
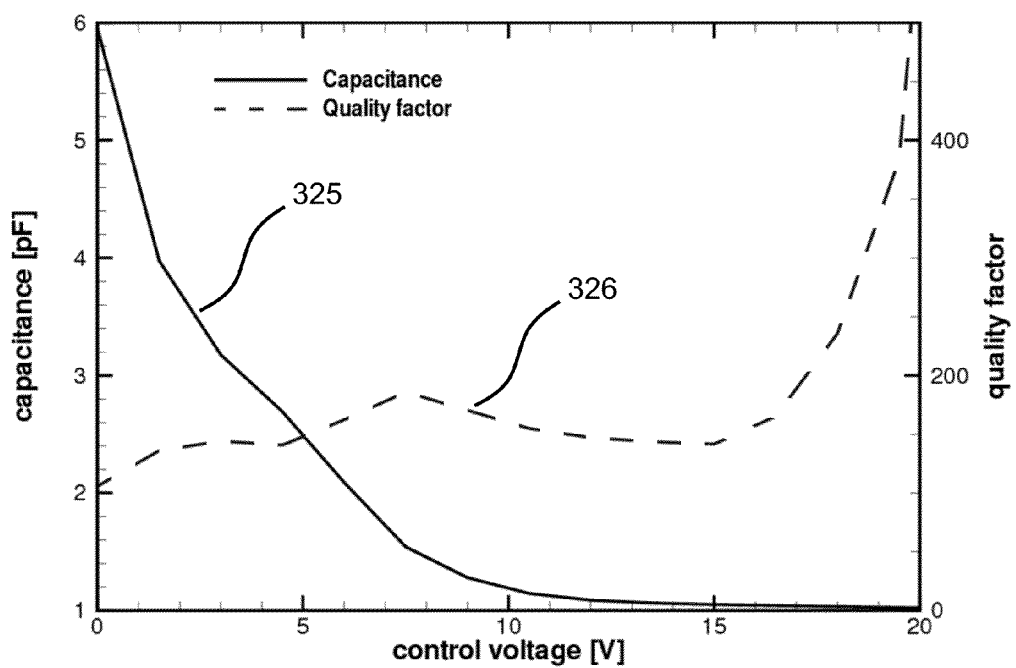

FIG. 38 shows the capacitance value and the quality factor as a function of the control voltage as obtained from the numerical simulation of the circuit of FIG. 37 (a).

Figure 39:
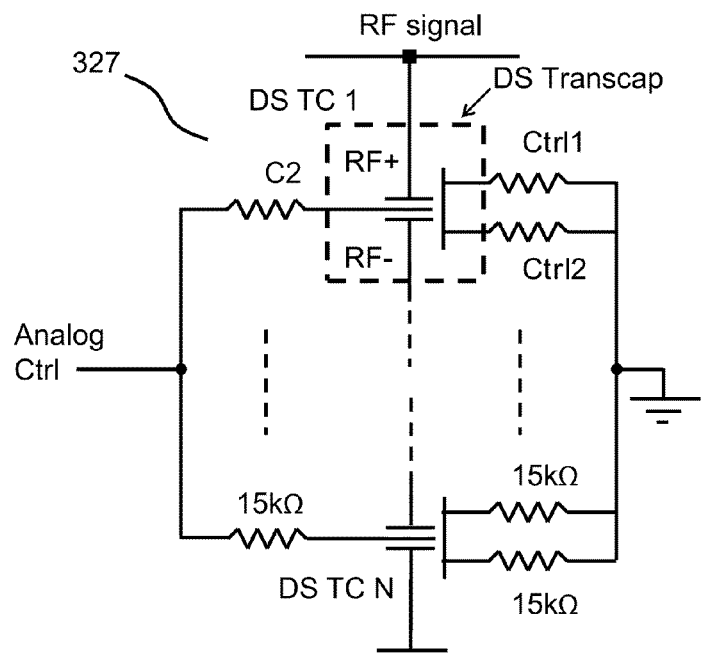

FIG. 39 shows an example of how to connect in series multiple differential-series transcap devices.

Figure 40:
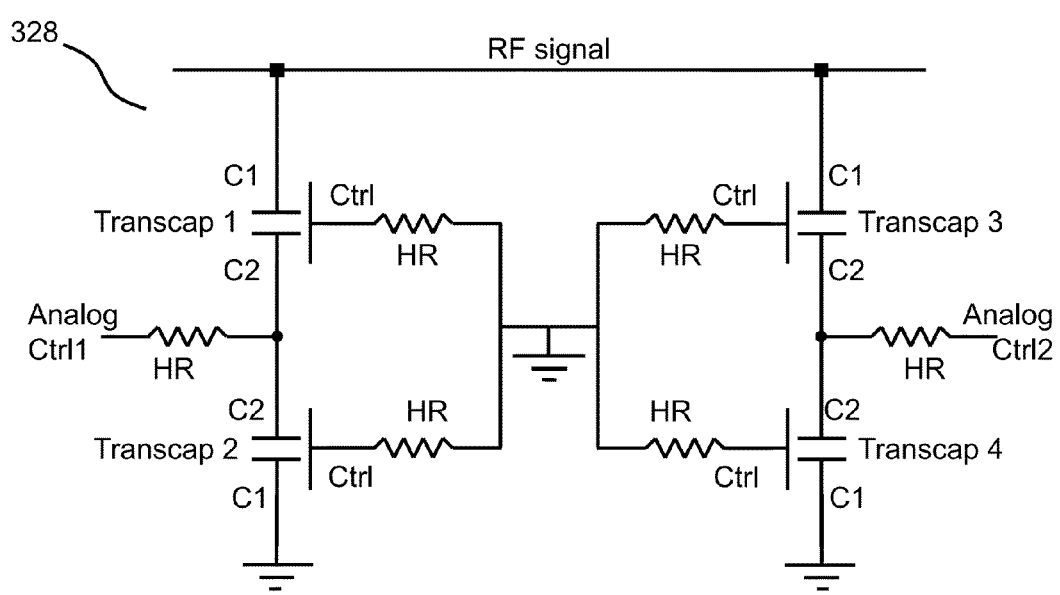

FIG. 40 shows an example of how to connect in parallel multiple differential-series transcap devices.

Figure 41:
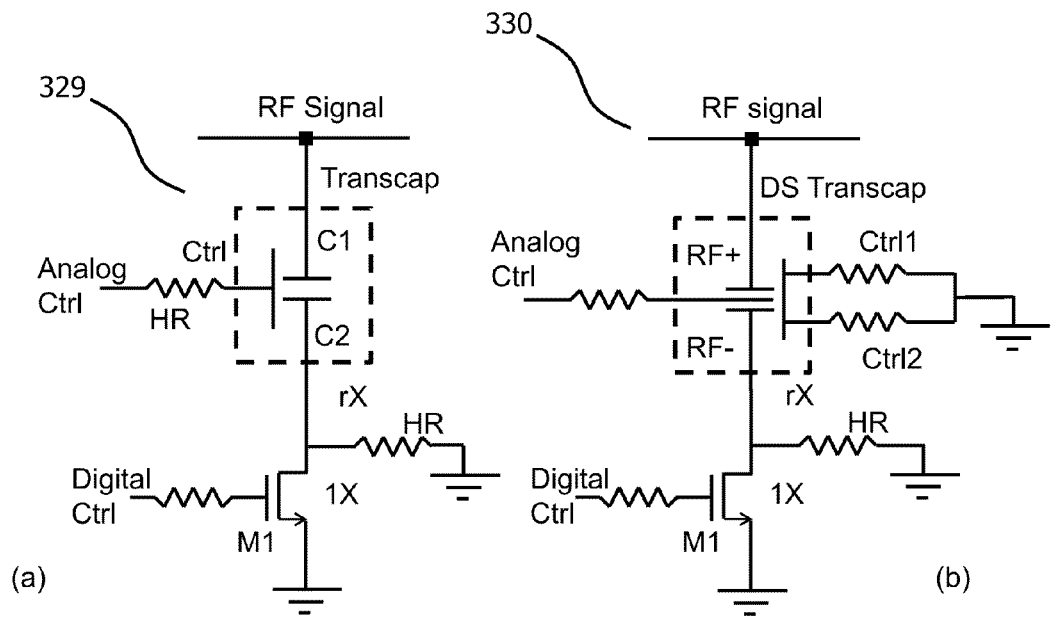

FIG. 41 shows two possible hybrid control configurations for a transcap device and a differential-series transcap device.

Figure 42:
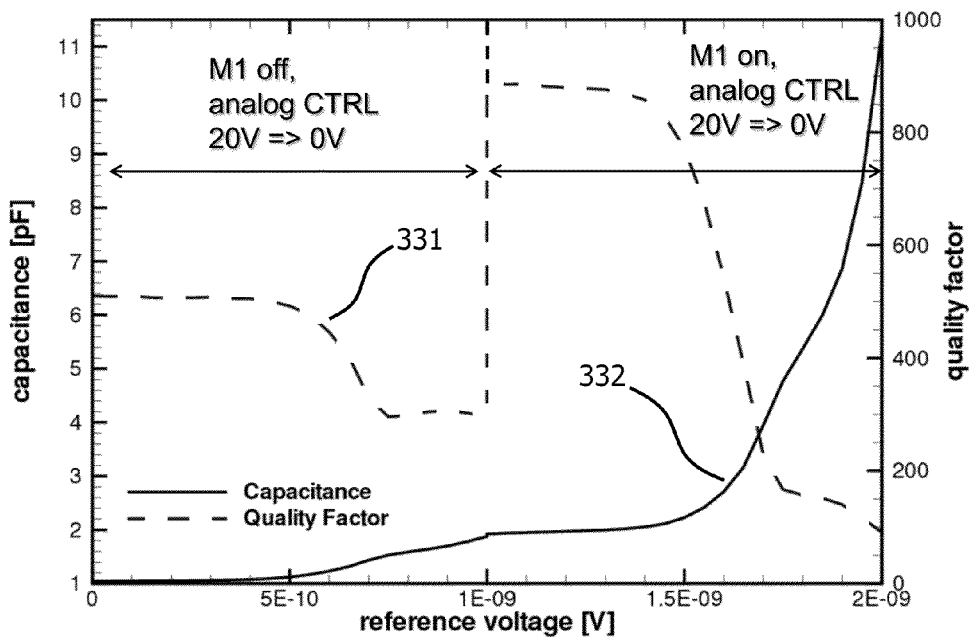

FIG. 42 shows the capacitance value and the quality factor as a function of the control voltage as obtained from the numerical simulation of the circuit of FIG. 41 (b).

Figure 43:
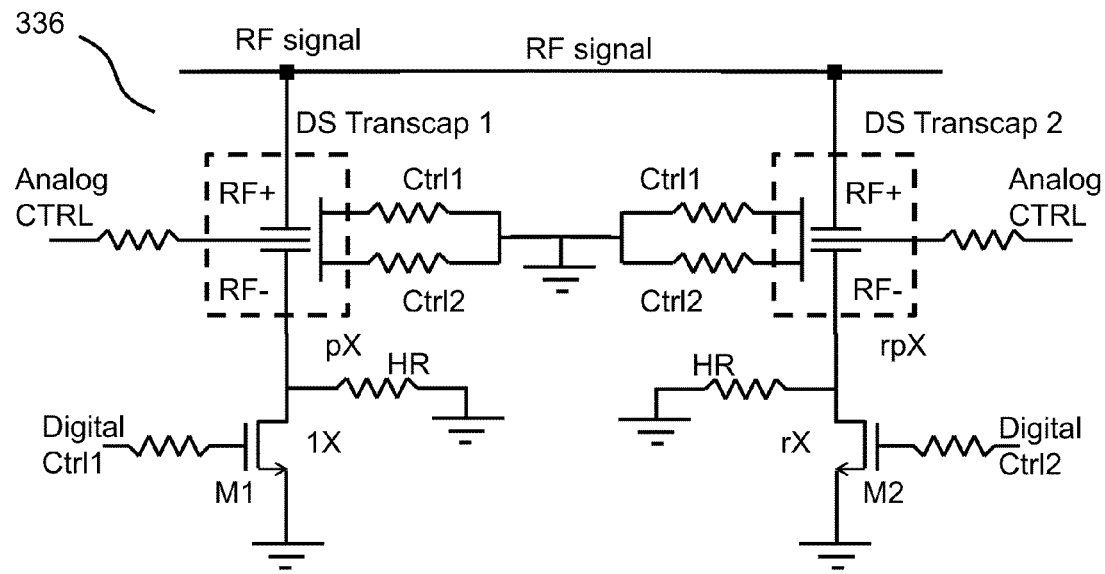

FIG. 43 shows the parallel of two hybrid controlled DS transcap devices.

Figure 44:
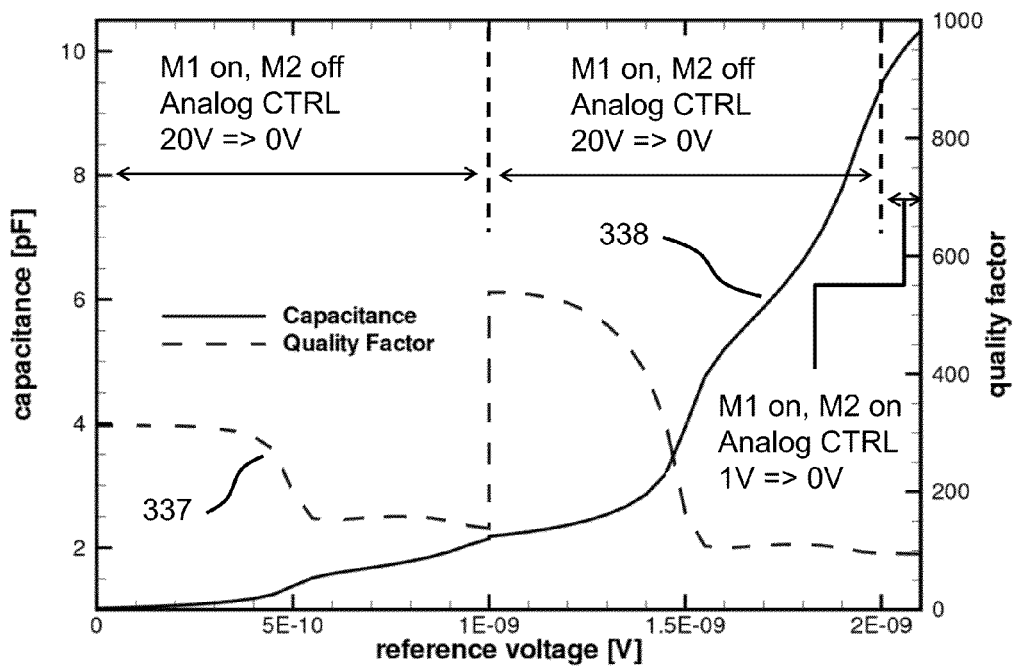

FIG. 44 shows the capacitance value and the quality factor as a function of the control voltage as obtained from the numerical simulation of the circuit of FIG. 43.

DETAILED DESCRIPTION OF SPECIFIC EMBODIMENTS

A FIG. 1

FIG. 1 is showing the preferred embodiment of the invention as described in the regular patent application U.S. Ser. No. 13/068,161 entitled "Semiconductor Variable Capacitor", filed by the same applicants on May 5, 2011. The pt type region 5 defines the control terminal of the device whereas the region 2 and the n+ region 8 are the two terminals of the capacitor. Region 3 corresponds to the capacitor dielectric layer, whereas region 10 is a n-type semiconductor layer. $x_L$ is the distance between the capacitance plate 2 and the p+ control region 5, whereas L is the length of the lower effective capacitance plate 2. The lower capacitance plate is constituted by the neutral region of the semiconductor layer 10, and is connected to the C2 terminal 9 through the n+ region 8. The C1 electrode 2 may be built in poly-silicon or metal.

B FIG. 2

Figure 2:
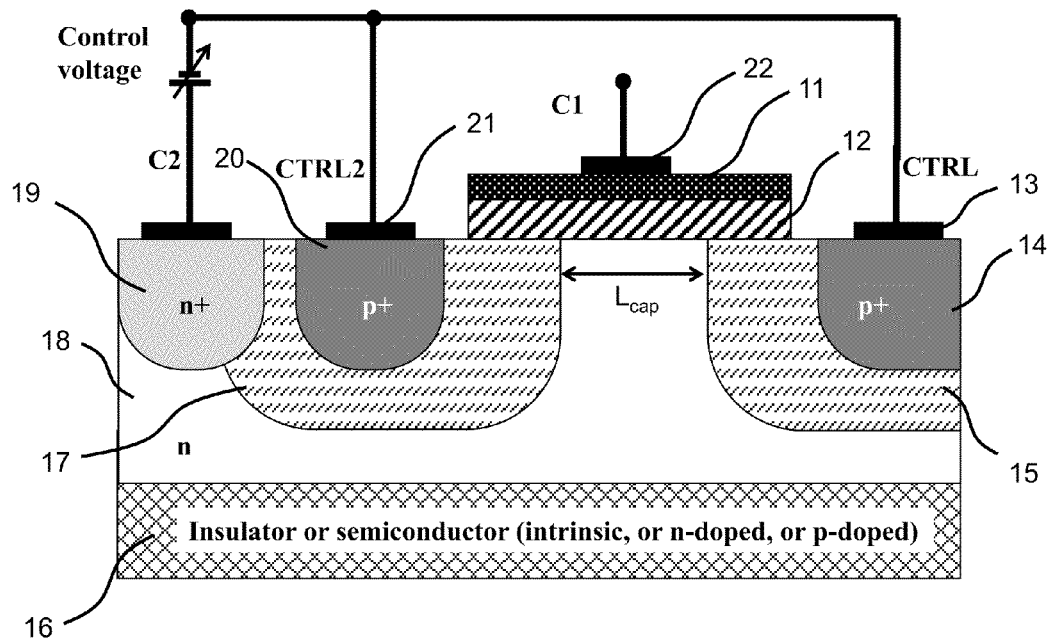
FIG. 2 shows a cross section view of a semiconductor variable capacitor according to a further embodiment of the invention, where a second control region has been added.

FIG. 2 is depicting the cross-section view of a semiconductor variable capacitor according to a further embodiment of the invention. This structure is similar to the one shown in FIG. 1, with the difference that a second control terminal CTRL2 has been added to the structure. The presence of CTRL2 allows for the reduction of the voltage required to deplete the semiconductor area under the oxide 12. However, the quality factor of the structure is reduced as well due to the geometry of the device. In order to avoid this collateral effect, the C2 implantation 19 can be placed in the third dimension, i.e. in the direction perpendicular to the cross section shown in FIG. 2.

C FIG. 3

Figure 3:
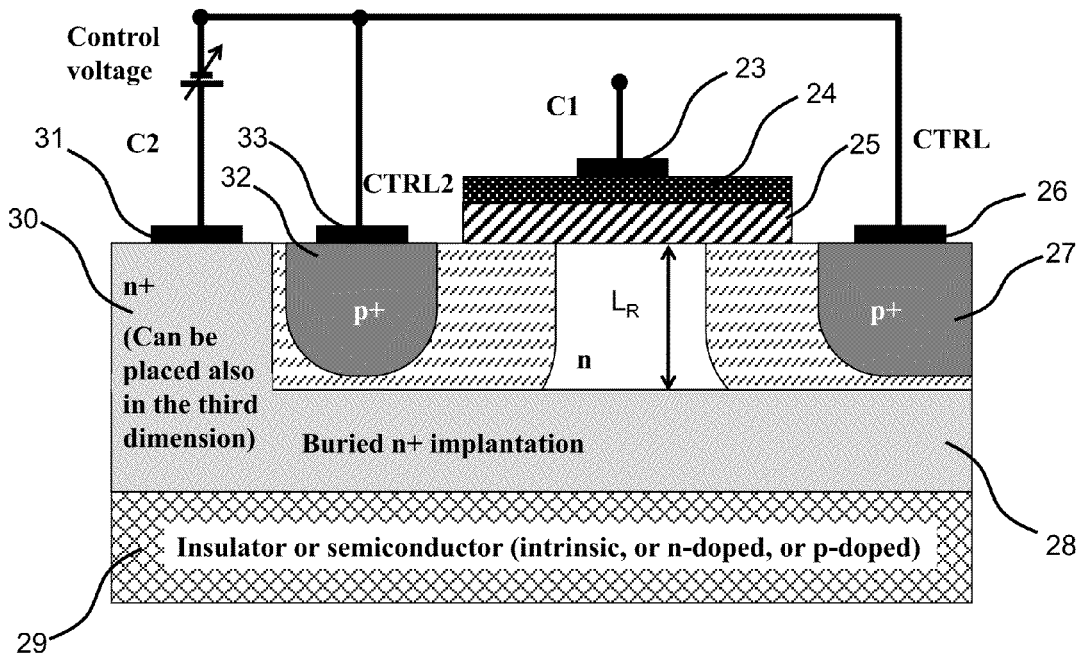
FIG. 3 shows a cross section view of a semiconductor variable capacitor according to a further embodiment of the invention, where a second control region and a buried implantation have been added to the structure.

FIG. 3 is depicting the cross-section view of a semiconductor variable capacitor according to a further embodiment of the invention, where a n+ buried implantation has been added in order to minimize the parasitic resistance associated with the C2 terminal 31. Also in this case, if desired, the C2 sink implantation can be placed in the third dimension, i.e. in the direction perpendicular to the cross section shown in FIG. 3.

D FIG. 4

Figure 4:
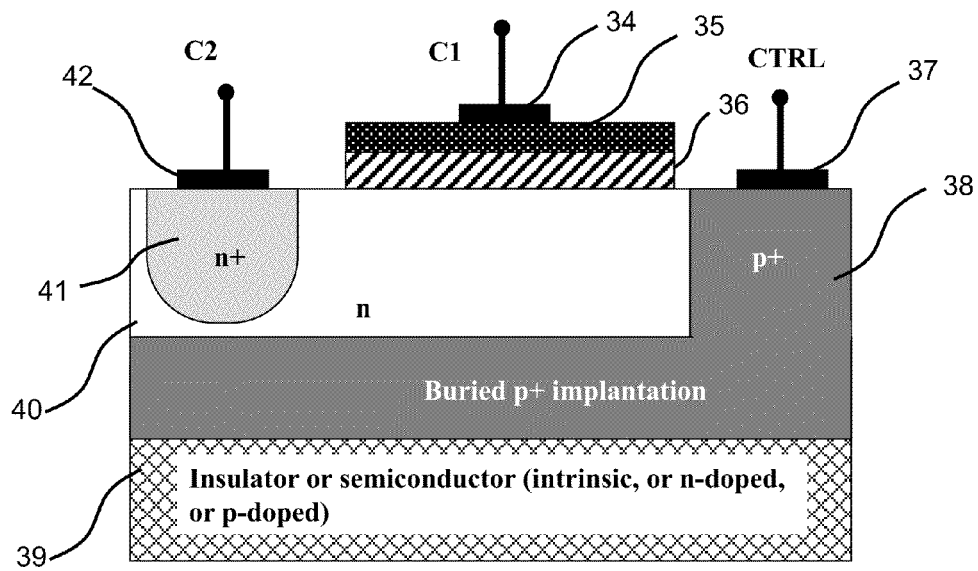
FIG. 4 shows a cross section view of a semiconductor variable capacitor according to a further embodiment of the invention, where a p+ buried implantation has been added to the structure in order to improve the control on the depletion region underneath the C1 oxide.

FIG. 4 is depicting the cross-section view of a semiconductor variable capacitor according to a further embodiment of the invention, where the control of the depletion region under the C1 oxide has been increased by adding a p+ buried implantation. This configuration is preferable with respect to the one shown in FIG. 3, since the quality factor can be maximized maintaining a high control on the depletion region under the oxide.

E FIG. 5

Figure 5:
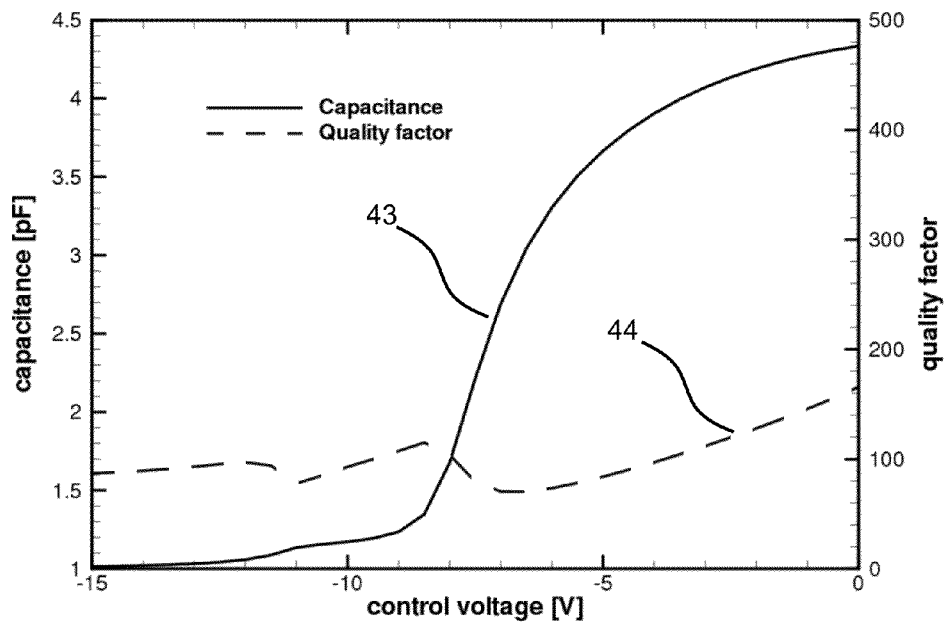
FIG. 5 shows the capacitance value and the quality factor as a function of the control voltage as obtained from the numerical simulation of the embodiment of FIG. 4.

FIG. 5 shows an example of CV characteristic of a transcap device implemented according to the embodiment of FIG. 4. In this plot, the capacitance 43 between the C1 and C2 terminals and the quality factor 44 of the device (for a 2 GHz RF signal) are shown as a function of the control voltage.

F FIG. 6

Figure 6:
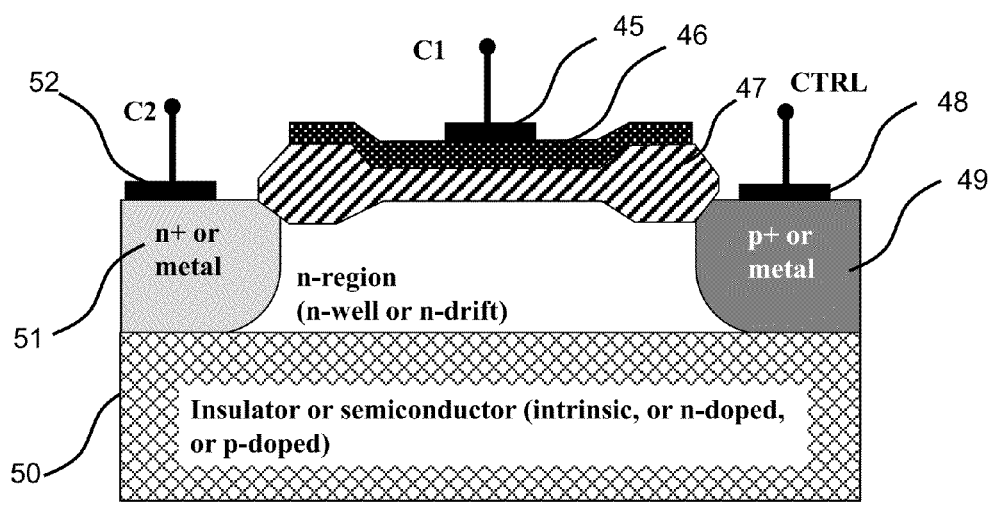
FIG. 6 shows a cross section view of a semiconductor variable capacitor according to a further embodiment of the invention, where two shallow trench isolating regions have been added at the edges of the C1 oxide to reduce the parasitic capacitances of the device.

FIG. 6 is depicting the cross-section view of a semiconductor variable capacitor according to a further embodiment of the invention, where shallow trench isolations have been created at the edges of the C1 terminal in order to minimize the parasitic capacitance associated with the control region and to allow for an improved isolation of the n+ region for high control voltages. In general, a STI region can be created also only on the CTRL terminal side or only at the C2 terminal side, depending on the process characteristics and performance requested by the application.

G FIG. 7

Another interesting implementation of a transcap device is shown in FIG. 7, where a p-doped (or intrinsic, or near-intrinsic) region 56 has been added between the p+ region 58 and the n region 62 in order to improve the breakdown of the pn junction and at the same time to reduce the parasitic capacitance between C1 and the CTRL terminal. Another possible implementation is to replace completely the n-region 62 under the oxide 55 with a p doped region.

H FIG. 8

The embodiments illustrated above are based on a MOS structure. This makes the capacitance value depending on the voltage $V_{C1C2}$ between the terminal C1 and C2. In order to decrease the capacitance dependence on the voltage $V_{C1C2}$, the control region 2 of FIG. 1 can be made in semiconductor of the same (or opposite) doping type and similar impurities concentration of the substrate as illustrated in FIG. 8.

The symmetry created in this configuration between the two terminals of the capacitance partially compensates the carrier modulation by the RF signal applied to the main terminal of the device, reducing the capacitance dependence from the $V_{C1C2}$ voltage.

I FIG. 9

Another embodiment of the present invention is illustrated in FIG. 9. In this case, an extra oxide layer 72 has been added on the top of the structure in order to decrease the distortion of the device with respect to the RF signal applied between C1 and C2.

J FIG. 10

A similar approach has been used in the embodiment of FIG. 10, where regions 79 and 80 of FIG. 9 have been replaced with a single highly conductive layer 90.

K FIG. 11

In order to significantly limit the dependence of the MOS capacitor from the $V_{C1C2}$ voltage and at the same time increase the specific capacitance, the embodiment of FIG. 11 can be utilized. As it can be seen, this embodiment is similar to the one shown in FIG. 1, with the exception that a multiplicity of small semiconductor pillars 101 has been formed on the top of the semiconductor layer 94. Above these semiconductor pillars, the capacitance dielectric 100 has been grown (or deposited) and the C1 region 92 has been formed. The upper portion 93 of these semiconductor pillars 101 has been heavily doped in order to maximize the specific capacitance and make the MOS system independent from the $V_{C1C2}$ voltage.

L FIG. 12

In order to reduce the quantized nature of the structure illustrated in FIG. 11, an extra dielectric layer 105 can be inserted between the pillars and the semiconductor layer 106 as shown in FIG. 12. In this case the extra dielectric 105 improves the characteristic of the device, smoothing out the capacitance variation as a function of the control voltage.

M FIG. 13

FIG. 13 shows the capacitance 115 between the two main terminals C1 and C2 of the structure and the quality factor 114 as a function of the control voltage as obtained from the numerical simulation of the embodiment of FIG. 12.

N FIG. 14

FIG. 14 is depicting the cross-section view of a semiconductor variable capacitor according to a further embodiment of the invention, where the upper dielectric layer 104 of FIG. 12 has been omitted, so that the pillars are directly connected to the C1 terminal in order to simplify the manufacturing process. Also in this case, a portion or the entire pillars can be highly doped to minimize the dependence of the capacitance value from the voltage applied between the two main terminals C1 and C2.

O FIG. 15

FIG. 15 is depicting the cross-section view of a semiconductor variable capacitor according to a further embodiment of the invention, where the pillars are made in heavily doped semiconductor or metal.

In the embodiment of FIG. 15, where the highly doped regions (or metal regions) inside the pillars extend down to the oxide layer 130, the pillar structures can be formed as an array of MOSFET gates, one near the other, by utilizing each polysilicon (o metal) gate region as a pillar. Alternatively, the structure pillars can be formed with deposition (or growth) process step followed by a semiconductor etch, or with multi-layer deposition process steps followed by polishing of the upper surface in order to level the final structure before the formation of the highly conductive region 128.

P FIG. 16

FIG. 16 is depicting the cross-section view of a semiconductor variable capacitor according to a further embodiment of the invention, where a heavily doped buried region 144 has been added in order to increase the control on the device characteristic. A similar implantation of opposite doping-type can also be used to decrease the parasitic resistance associated with the C2 terminal.

Q FIG. 17

A double control configuration can be obtained by adding a second p+ region 158 as illustrated in FIG. 17. Also in this case, a buried implant 155 can be added in order to decrease the parasitic resistance associated with the C2 terminal 157.

R FIG. 18

If the manufacturing process utilized does not allow for low defect dielectric/semiconductor interfaces, as it can be the case in III-V technologies, the performance of the transcap device could be affected. In order to overcome this limitation, the insulating layer of the variable capacitor can be replaced with a (doped or intrinsic) wide energy-gap semiconductor layer. In this case, the C1 terminal can be formed directly in contact with the energy-gap semiconductor layer so as to form a Schottky contact.

Alternatively, as shown in FIG. 18, a (doped or intrinsic) low energy-gap semiconductor layer 164 can be interposed between the energy-gap semiconductor layer 169 and the C1 contact region 163 in order to minimize the conduction between the C1 terminal and the other device terminals. Another possibility is to use a dielectric material to form region 164 in order to further improve the isolation of the C1 terminal, without affecting the device performance.

S FIG. 19

As shown in FIG. 19, the present invention can also be realized using a vertical configuration. The vertical geometry of the device drastically increases the capacitance per unit area without requiring silicon on insulator process technology, which significantly lowers the cost of the device. This configuration can be a valid alternative especially in the case where p+ implantations are not available in the manufacturing process.

In this structure a p+ doped layer 174 replaces the p+ implantation and the depletion region moves vertically instead of horizontally with respect to the main substrate plain. It is important to notice that the n+ region 177 and the p+ region 174 can be reversed, by forming the n+ region on the bottom of the device and the p+ region on the top.

T FIG. 20

FIG. 20 illustrates another vertical embodiment of the present invention. As it can be seen, in this structure the contact with respect to the C2 terminal has been placed in the third dimension, i.e. in the direction perpendicular to the cross section. Furthermore, a fourth terminal 186 has been added to the device so as to allow for the direct connection of the present structure in a floating RF configuration.

U FIG. 21

A planar implementation of the embodiment of FIG. 20 is shown in FIG. 21, where two RF regions are present between the p+ region 193 and the n+ region 195.

V FIG. 22

The formation of the control or C2 region in the third dimension is a concept that can be used for any of the described structures in order to increase the control on the device characteristic without degrading the quality factor.

An example of embodiment of the present invention where the C2 implantation 205 has been placed in the third dimension is shown in FIG. 22. In this case, two insulating regions 204 and 206 (formed for example by Shallow Trench Isolations) can also be added on the sides of the n+ implantation 205 as shown in figure, in order to improve the device performance.

W FIG. 23

FIG. 23 is depicting the cross-section view of a semiconductor variable capacitor according to a further embodiment of the invention, where a third control region 210 has been added behind the C1 terminal 209 in order to further improve the control on the device capacitance and the overall CV characteristic of the device.

X FIG. 24

Another variant is shown in FIG. 24, where an extra n+ region 219 has been added behind the C1 terminal 218 (instead of the third p+ region 210 of FIG. 23) in order to increase the quality factor of the device.

Y FIG. 25

An example of CV characteristic 230 obtained from the simulation of the structure of FIG. 22, is illustrated in FIG. 25. Again also the quality factor 229 of the device for a 2 GHz RF signal is reported in the same plot.

Z FIG. 26

FIG. 26 is depicting the cross-section view of a semiconductor variable capacitor according to a further embodiment of the invention. This structure is similar to the one shown in FIG. 22, with the difference that an n+ buried implantation has been added to the structure in order to minimize the parasitic resistance associated with the C2 terminal.

AA FIG. 27

FIG. 27 is depicting the cross-section view of a semiconductor variable capacitor according to a further embodiment of the invention. This structure is similar to the one shown in FIG. 22, with the difference that a p+ buried implantation has been added to the structure in order to improve the control on the depletion region underneath the C1 oxide. In general many doping profiles can be utilized in order to improve the device performance depending on the available process technology. A graded doped region under the C1 oxide can also be exploited in order to shape the CV characteristic of the device.

AB FIG. 28

In FIG. 28 is shown a transcap device where the pn-junction between the CTRL terminal 249 and the C2 terminal 255 has been formed with a super-junction profile, i.e. a series of p and n stripes alternated one to each other, in order to increase the breakdown voltage of the junction itself.

AC FIG. 29

In FIG. 29 is reported a slightly different implementation, where the super-junction profile has been formed only on one side of the structure, living a uniformly n-doped region 266 underneath the oxide 257.

In many of the described embodiments, the p+ region can be replaced by a Schottky contact and/or the n+ region can be replaced with a metal ohmic contact. In the case where a Schottky contact is used in combination with a III-V process technology, an extra wide energy-gap layer can be interposed between the metal and the n-doped semiconductor in order to reduce the current leakage associated with the Schottky contact.

All the described embodiments can be built in many different technologies, comprising: Bulk, Silicon On Insulator, Silicon On Sapphire or III-V technology with or without hetero-junctions. It is important to notice that a transcap device can also be utilized as a simple varactor by short-circuiting the CTRL terminal with the C1 (or C2) terminal.

All the embodiments illustrated above can be realized as both discrete or integrated components with minimal changes. For each one of them, the dual version can be obtained by simply substituting the n-doped implants with p-type ones and vice-versa. Many other configurations can be obtained combining the different embodiments and their variants.

Most of the structures described above can be realized with a standard SOI or bulk CMOS process. The distance between the doping implants and the upper capacitance electrode C1 can be omitted by auto-aligning the implantations with the MOS structure or can be obtained by adding two spacers to the structure during the fabrication process. In some of the embodiments, one or more extra process steps can also be required in order to form the pillars in the silicon substrate (by means of a silicon etching or a deposition process steps) and/or to obtain the buried implantation region at the beginning of the MOS process.

AD FIG. 30

FIG. 30 illustrates the most conventional control configurations of an analog transcap. As shown in FIG. 30 ($a$), a high value resistance HR can be placed in series to the Ctrl terminal in order to bias the device control terminal without affecting the RF performance of the device.

FIG. 30 ($b$) shows a possible variant of this configuration, where two anti-parallel diodes have been inserted in series to the high impedance HR in order to increase the AC decoupling between the analog bias and the control terminal of the transcap device. A similar approach can be utilized for all the control configurations herein disclosed. Furthermore, the HR resistor can also be replaced with an inductance as shown in FIG. 30 ($c$).

AE FIG. 31

FIG. 31 shows an improved control configuration with respect the ones of FIG. 30, where a series capacitor $C_{series}$ has been added between the transcap device and one of the RF terminals. In this case, the control terminal of the transcap device can be coupled through a high impedance to ground (or to a bias DC source), and the middle node (obtained by coupling the C2 terminal to the series capacitance) can be used to modulate the total capacitance seen by the RF signal, by applying a positive DC bias. This configuration utilizes a positive control voltage and is suitable for both shunt or series tuning capacitor configurations.

It is important to notice that, by utilizing the control configuration described above, the tuning range of the transcap device significantly increases. The DC control voltage not only modulates the depletion region of the pn junction between CTRL and C2, but also the carrier population at the oxide/semiconductor interface underneath the C1 terminal. A DC voltage is indeed present also across the oxide layer allowing for a higher control on the overall capacitance between C1 and C2. In this configuration the C1 terminal of the transcap device can be biased through a third high impedance (not shown in figure) in order to guarantee the correct bias of the structure.

AF FIG. 32

An even better performing approach is shown FIG. 32 ($a$), where two transcap devices TC1 and TC2 are connected back-to-back and the control terminals Ctrl1 and Ctrl2 are biased through two high impedances. The middle node obtained by coupling the two C2 terminals become therefore a third control terminal, which can also be used to modulate the capacitance seen by the RF signal. Also in this case, the RF terminals of the transcap device can be biased through high impedances (not shown in figure) in order to guarantee the correct operation of the transcap devices.

As shown in FIG. 32 ($b$) the differential series resulting from the connection back-to-back of two transcap devices can be seen as a single device with 5 terminals (RF+, RF−, C2, Ctrl1, Ctrl2), where two of them (RF+ and RF−) are dedicated to the RF signal and three (C2, Ctrl1, and Ctrl2) are used to modulate the capacitance value seen between RF+ and RF−. Hereafter, when possible, the symbol shown in FIG. 32 ($b$) will be utilized to represent the described 5 terminal differential series transcap device (DS Transcap) in order to simplify the circuit schematic.

AG FIG. 33

FIG. 33 shows an example of implementation of the described series approach, where two transcap structures resembling the one of FIG. 1 have been connected back-to-back in series to form a 5 terminal device.

AH FIG. 34

Another example of implementation of a DS transcap device obtained from the structure of FIG. 15 is reported in FIG. 34.

AI FIG. 35

FIG. 35 illustrates another possible implementation of the series approach by using the building block of FIG. 22. As well known to anyone skilled in the art, the same approach can be utilized with all the transcap structures herein described and their variants. In general, the ratio between the two transcap structures composing the differential-series configuration can be made different from the unity in order to cancel or minimize distortion effects, and improve the linearity of the system.

AJ FIG. 36

Another interesting implementation of the differential-series approach is shown in FIG. 36, where the C2 implantation 318 has been placed before the two RF terminals 313 and 322. In this structure a buried n+ implantation 317 has been added in order to decrease the parasitic resistance associated with the C2 terminal. However, as previously discussed for the other embodiments, this buried implantation is optional.

AK FIG. 37

FIG. 37 shows two possible control configurations that can be used to bias the different terminals of a 5 terminals DS transcap device. As it can be seen, in both configurations, the Ctrl1 and Ctrl2 terminals have been coupled to ground through high impedances, and the central control terminal C2 has been used to modulate the device capacitance between RF+ and RF−terminals.

AL FIG. 38

FIG. 38 illustrates the resulting CV characteristic 325 and the quality factor 326 obtained with one of the described DS devices. Due to the differential nature of this structure, the distortion induced by the presence of the parasitic capacitances between the Ctrl1 and Ctrl2 terminals and the RF terminals, is minimized. The RF signal propagates both in the C2 terminal and in the Ctrl1 and Ctrl2 terminals, such as its net effect on "$V_{CTRL}$-$V_C2$" is minimized for both transcaps composing the differential-series.

In principle, the Ctrl1 and Ctrl2 terminals can also be shorted together, however this approach can significantly degrade the device tuning range, especially in the case where the capacitance between Ctrl1 and C2 (and/or between Ctrl2 and C2) is comparable to the one between C2 and RF+(and/or between C2 and RF−) as in the case of an SOI process with a thin silicon active layer (in this case, the shortening of the two controls terminals Ctrl1 and Ctrl2 can decrease the tuning range by a factor greater than 2).

AM FIG. 39

As shown in FIG. 39, by using the control configurations of FIG. 37, more structures can be placed in series by short-circuiting the resistors coupled to the C2 terminals, in order to withstand higher RF voltages.

AN FIG. 40

As shown in FIG. 40, multiple differential-series devices can also be places in parallel (or anti-parallel). In this case, the dimensions of the 4 transcaps can be optimized in order to optimize the linearity of the system, for example by sizing the $1^{st}$ transcap in order to match the dimensions of the $4^{th}$ one, and by sizing the $2^{nd}$ to match the $3^{rd}$ one so as to obtain an anti-parallel configuration. If desired, the two analog controls can be coupled together in order to simplify the driving circuitry.

AO FIG. 41

FIG. 41 illustrates another interesting control configuration, where a hybrid approach between analog and digital solution is presented as a switch is placed in series to the described variable capacitor. In this configuration, the size of the transistor M1 must be opportunely chosen in order to maximize the tuning range, maintaining at the same time the possibility of choosing in a continuous fashion all the possible capacitance values in the selected tuning range.

The modus operandi of this configuration is quite simple. Referring to FIG. 41 (a), the minimum capacitance value (seen from the RF signal) is obtained when the transistor M1 is turned off, and the analog control terminal of the transcap device is biased at high negative voltages so as to minimize the capacitance value between C1 and C2. The maximum capacitance value, instead, is obtained when M1 is turned-on and the analog control voltage is set to zero. The intermediate capacitance values can be obtained by turning-on or off M1, and by varying the analog control voltage fed to the analog control terminal. Similar considerations hold true also for the configuration of FIG. 41 (b), where a DS transcap has been placed in series to a MOS device.

AP FIG. 42

In order to better understand how this configuration works, in FIG. 42 is illustrated one example of CV characteristic 332 and the quality factor obtained with the control configuration of FIG. 41 (b). In the x-axes the reference voltage is shown (which is used only as a reference for the plot, since the analog control voltage is increased from positive values to 0V for each combination of Digital Ctrl analyzed).

The transistor M1 can also be replaced with a multiplicity of transistors (connected in series or in parallel to each other). In this case, opportunely choosing the ratio between the different components of the network, it is possible to increase the tuning range of the network.

AQ FIG. 43

FIG. 43 illustrates another interesting configuration, where two of the previous networks have been connected in parallel. In this configuration, the devices belonging to the second branch of the parallel (DS Transcap 2 and M2) must be opportunely sized in order to increase as much as possible the capacitance tuning range, maintaining at the same time the possibility of choosing in analog fashion all the possible capacitance values in the selected tuning range.

The operation of this configuration is similar to the one of the network shown in FIG. 41. The minimum capacitance value (seen from the RF signal) is obtained when both transistors M1 and M2 are turned off, and the analog control terminals of the two transcap devices (which are short-circuited through two high impedances in order to simplify the overall control circuitry) are biased at high positive voltages so as to minimize the capacitance values of DS Transcap 1 and DS Transcap 2. The maximum capacitance value, instead, is obtained when both transistor M1 and M2 are turned-on and the analog control voltage is set to zero. The intermediate capacitance values can be obtained tuning-on only M1, only M2, both or none of them, and varying the analog control voltage.

If the dimensions of the two transistors M1 and M2 and the size of DS Transcap 1 and DS Transcap 2 are opportunely chosen, for example such as M2 and DS Transcap 2 are both r times bigger than M1 and DS Transcap 1, respectively, all the intermediate capacitance values can be chosen in an analog fashion way.

AR FIG. 44

In FIG. 44 is shown how to control the described configuration in order to achieve all the intermediate values in the whole tuning range. In this particular example, the size of two transistors M1 and M2 has been chosen such as when one of the two is turned-off its respective branch does not influence much the total capacitance value. In this case therefore, the configuration where both transistors M1 and M2 are turned-off has been excluded from the analog tuning range analyzed. Also in this case, as in FIG. 42, in the x-axes a reference voltage which is used only as a reference for the plot is shown, since the analog control voltage is increased from positive values to 0V for each combination analyzed of the digital controls Digital Ctrl1 and Digital Ctrl2.

It is important to notice that, if desired, the two analog controls of the two transcap devices can be separated and driven independently. Furthermore, more capacitive branches can be coupled in parallel using a similar configuration.

In all the configurations described above, the capacitance between the control terminal of each transcap device and the C2 terminal can be increased in order to improve the linearity of the overall network. Alternatively, external or integrated capacitors can also be added in order to increase the C2-CTRL capacitances. In particular with the differential series approach, external or integrated capacitors can be added between the two control terminals or between each control terminal and the central node of the series, in order to improve the linearity of the system.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A semiconductor variable capacitor comprising:
   a first equivalent capacitance plate;
   a second equivalent capacitance plate;
   at least one control region;
      wherein the capacitance value between said first and second capacitance plates of said semiconductor variable capacitor is varied by varying a control voltage;
      wherein said control region forms a rectifying junction with said first capacitance plate, and
      wherein the variation of said control voltage causes a variation of the voltage drop across said rectifying junction.

2. The semiconductor variable capacitor of claim 1, further comprising at least a barrier layer formed at least partially between said first and said second capacitance plates,
   wherein said barrier layer is made of one of the materials belonging to the group comprising dielectric and wide band-gap semiconductor materials, and
   wherein the capacitance value between said first and said second capacitance plates is varied by depleting or enhancing at least a portion of a semiconductor material in physical contact with said barrier layer of said semiconductor variable capacitor.

3. The semiconductor variable capacitor of claim 1, further comprising:
   a third equivalent capacitance plate;
   at least a first barrier region formed at least partially between said first and said second capacitance plates;
   at least a second barrier region formed at least partially between said first and said third capacitance plates;
      wherein said first and second barrier regions are made of one of the materials belonging to the group comprising dielectric and wide band-gap semiconductor materials, and
      wherein the capacitance value between said second and third capacitance plates is varied by depleting or enhancing at least a portion of a semiconductor material in physical contact with at least one of said first and second barrier regions of said semiconductor variable capacitor.

4. The semiconductor variable capacitor of claim 1, further comprising:
   a semiconductor region wherein said control region is formed;
   at least one barrier layer covering at least a portion of a surface of said semiconductor region;
   a conductive region covering at least a portion of a surface of said barrier layer;
      wherein said barrier layer is made of one of the materials belonging to the group comprising dielectric and wide band-gap semiconductor materials, and
      wherein said semiconductor region and said conductive region form, respectively, said first and second capacitance plates of said semiconductor variable capacitor.

5. The semiconductor variable capacitor of claim 1, further comprising:
   a multiplicity of pillar structures;
      wherein said multiplicity of pillar structures comprises pillar structures coupled in parallel, and
      wherein the capacitance value between said first and second capacitance plates of said semiconductor variable capacitor is varied by modulating, by means of a depletion region generated by said control voltage, the coupling of at least one of said pillar structures coupled in parallel with at least one of said first and second capacitance plates.

6. A semiconductor variable capacitor comprising at least a first and a second semiconductor variable capacitor according to claim 1,
   wherein the first capacitance plate of said first semiconductor variable capacitor is directly coupled to the first capacitance plate of said second semiconductor variable capacitor.

7. A differential semiconductor variable capacitor comprising at least a first and a second semiconductor variable capacitor according to claim 1,
   wherein the control regions of said first and second semiconductor variable capacitors form, respectively, a first and a second control region of said differential semiconductor variable capacitor;
   wherein the first capacitance plates of said first and said second semiconductor variable capacitors are directly coupled to a third control region of said differential semiconductor variable capacitor;
   wherein said first, said second and said third control regions are directly coupled, respectively, to a first, a second and a third control terminals of said differential semiconductor variable capacitor, and
   wherein the second capacitance plates of said first and said second semiconductor variable capacitor are directly coupled, respectively, to a fourth and a fifth terminal of said differential semiconductor variable capacitor.

8. A differential semiconductor variable capacitor comprising at least a first and a second semiconductor variable capacitor according to claim 1,
   wherein the control regions of said first and second semiconductor variable capacitors form, respectively, a first and a second control region of said differential semiconductor variable capacitor;
   wherein the first capacitance plates of said first and said second semiconductor variable capacitors are directly coupled to a third control region of said differential semiconductor variable capacitor, and
   wherein said control voltage is applied between said third control region and at least said first and second control regions.

9. A semiconductor variable capacitor comprising at least a semiconductor variable capacitor according to claim 1 directly coupled in series to at least a field effect transistor.

10. A method of operating a semiconductor variable capacitor comprising a first equivalent capacitance plate and a second equivalent capacitance plate, and at least one control region, the method comprising:
applying a control voltage between said first capacitance plate and at least one between said control region and said second capacitance plate;
wherein the capacitance value between said first and said second capacitance plates of said semiconductor variable capacitor is varied by varying said control voltage;
wherein said control region forms a rectifying junction with at least one of said first and second capacitance plate, and
wherein the variation of said control voltage causes a variation of the voltage drop across said rectifying junction.

11. The method of claim 10, wherein said semiconductor variable capacitor is comprising at least a barrier layer formed at least partially between said first and said second capacitance plate,
wherein said barrier layer is made of one of the materials belonging to the group comprising dielectric and wide band-gap semiconductor materials, and
wherein the capacitance value between said first and said second capacitance plates is varied by depleting or enhancing at least a portion of a semiconductor material in physical contact with said barrier layer of said semiconductor variable capacitor.

12. The method of claim 10, wherein said semiconductor variable capacitor comprises:
a third equivalent capacitance plate;
at least a first barrier region formed at least partially between said first and said second capacitance plates;
at least a second barrier region formed at least partially between said first and said third capacitance plates;
wherein said first and second barrier regions are made of one of the materials belonging to the group comprising dielectric and wide band-gap semiconductor materials, and
wherein the capacitance value between said second and third capacitance plates is varied by depleting or enhancing at least a portion of a semiconductor material in physical contact with at least one of said first and second barrier regions of said semiconductor variable capacitor.

13. A differential semiconductor variable capacitor comprising:
at least a first, a second and a third control region formed in a semiconductor region;
at least a first and a second conductive region forming, respectively, a first equivalent capacitance plate and a second equivalent capacitance plate of said differential semiconductor variable capacitor;
wherein said first, said second and said third control regions are directly coupled, respectively, to a first, a second and a third control terminals of said differential semiconductor variable capacitor;
wherein said first and said second conductive regions are directly coupled, respectively, to a fourth and a fifth terminal of said differential semiconductor variable capacitor;
wherein said first control region is directly coupled to said semiconductor region;
wherein each one of said second and said third control regions forms a rectifying junction with said semiconductor region, and
wherein the capacitance value between said fourth and fifth terminals of said differential semiconductor variable capacitor is varied by varying a control voltage applied between said first control terminal and at least two of the other terminals of said differential semiconductor variable capacitor.

14. The differential semiconductor variable capacitor of claim 13, wherein each one of said first, second and third control regions is coupled by means of a high impedance component to a bias voltage, and wherein an alternating signal is applied between said first and said second capacitance plates.

15. The differential semiconductor variable capacitor of claim 13 comprising at least a first barrier region between said first capacitance plate and said semiconductor region and at least a second barrier region between said second capacitance plate and said semiconductor region,
wherein said first and said second barrier regions are made of one of the materials belonging to the group comprising dielectric and wide band-gap semiconductor materials, and
wherein the capacitance value between said first and said second capacitance plates is varied by depleting or enhancing at least a portion of the semiconductor material in physical contact with at least one of said first and said second barrier regions.

16. The differential semiconductor variable capacitor of claim 13, comprising:
a multiplicity of pillar structures;
wherein the capacitance value between said fourth and fifth terminals of said semiconductor variable capacitor is varied by modulating, by means of a depletion region generated by said control voltage, the coupling of at least one of said pillar structures with at least one of said fourth and fifth terminals.

17. A semiconductor variable capacitor comprising at least a differential semiconductor variable capacitor according to claim 13 directly coupled in series to at least a transistor.

18. A method of operating a semiconductor variable capacitor comprising at least a first, a second and a third control region formed in a semiconductor region, and at least a first and a second conductive regions forming, respectively, a first equivalent capacitance plate and a second equivalent capacitance plate of said differential semiconductor variable capacitor, the method comprising:
applying a control voltage between said first control region and at least said second and said third control regions;
wherein said first, said second and said third control regions are directly coupled, respectively, to a first, a second and a third control terminals of said differential semiconductor variable capacitor;
wherein said first and said second conductive regions are directly coupled, respectively, to a fourth and a fifth terminals of said differential semiconductor variable capacitor;
wherein said first control region is directly coupled to said semiconductor region;
wherein each one of said second and said third control regions forms a rectifying junction with said semiconductor region, and
wherein the capacitance value between said fourth and fifth terminals of said differential semiconductor variable capacitor is varied by varying said control voltage.

19. The method of claim 18, wherein at least said first, second and third control terminals are biased each one by means a high impedance component, and wherein an alternating signal is applied between said fourth and said fifth terminals.

20. The method of claim 18, wherein at least said first, second and third control terminals are biased each one by means a high impedance component, and wherein said semiconductor variable capacitor is directly coupled in series to a digitally controlled field effect transistor.

* * * * *